(12) United States Patent
Okada et al.

(10) Patent No.: US 11,310,450 B2
(45) Date of Patent: Apr. 19, 2022

(54) SOLID-STATE IMAGING ELEMENT, IMAGING DEVICE, AND METHOD FOR CONTROLLING SOLID-STATE IMAGING ELEMENT

(71) Applicant: SONY SEMICONDUCTOR SOLUTIONS CORPORATION, Kanagawa (JP)

(72) Inventors: Chihiro Okada, Kanagawa (JP); Kouji Matsuura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/250,337

(22) PCT Filed: Apr. 15, 2019

(86) PCT No.: PCT/JP2019/016089
§ 371 (c)(1),
(2) Date: Jan. 7, 2021

(87) PCT Pub. No.: WO2020/017117
PCT Pub. Date: Jan. 23, 2020

(65) Prior Publication Data
US 2021/0281784 A1    Sep. 9, 2021

(30) Foreign Application Priority Data

Jul. 18, 2018 (JP) .............................. JP2018-134815

(51) Int. Cl.
H04N 5/335 (2011.01)
H04N 5/361 (2011.01)
(Continued)

(52) U.S. Cl.
CPC .......... *H04N 5/361* (2013.01); *H03M 1/1245* (2013.01); *H04N 5/3575* (2013.01); *H04N 5/365* (2013.01); *H04N 5/378* (2013.01)

(58) Field of Classification Search
CPC .. H04N 5/3745; H04N 5/37455; H04N 5/361; H04N 5/365; H04N 5/3575; H04N 5/378; H03M 1/1245
See application file for complete search history.

(56) References Cited

U.S. PATENT DOCUMENTS 8,553,114 B2 * 10/2013 Uchida .................. H04N 5/361
                                                                348/294
9,525,837 B1   12/2016 Eshel et al.
(Continued)

FOREIGN PATENT DOCUMENTS

CN     101257560 A    9/2008
CN     107925735 A    4/2018
(Continued)

OTHER PUBLICATIONS

International Search Report and Written Opinion of PCT Application No. PCT/JP2019/016089, dated Jul. 2, 2019, 07 pages of ISRWO.

*Primary Examiner* — Kelly L Jerabek
(74) *Attorney, Agent, or Firm* — Chip Law Group

(57) ABSTRACT

In a solid-state imaging element in which an ADC is disposed, deterioration of conversion accuracy of the ADC caused by a dark current is inhibited. A signal voltage sample-and-hold circuit samples and holds, as a sample signal voltage, a voltage obtained by dividing a difference between a voltage of a vertical signal line corresponding to a light reception amount in a pixel and a predetermined variable reference voltage. An analog-to-digital converter converts an analog signal corresponding to the sample signal voltage to a digital signal. A reference voltage control (Continued)

section performs control to modulate a value of the variable reference voltage according to a dark current amount in the pixel.

8 Claims, 25 Drawing Sheets

(51) Int. Cl.
*H03M 1/12* (2006.01)
*H04N 5/357* (2011.01)
*H04N 5/365* (2011.01)
*H04N 5/378* (2011.01)

(56) References Cited

U.S. PATENT DOCUMENTS

| | | |
|---|---|---|
| 2008/0211946 A1 | 9/2008 | Uchida |
| 2015/0015760 A1* | 1/2015 | Tsunai .................. H04N 5/372 |
| | | 348/311 |

FOREIGN PATENT DOCUMENTS

| | | |
|---|---|---|
| EP | 1968307 A2 | 9/2008 |
| JP | 2008-219293 A | 9/2008 |
| JP | 2013-255035 A | 12/2013 |
| WO | 2017/046668 A1 | 3/2017 |

* cited by examiner

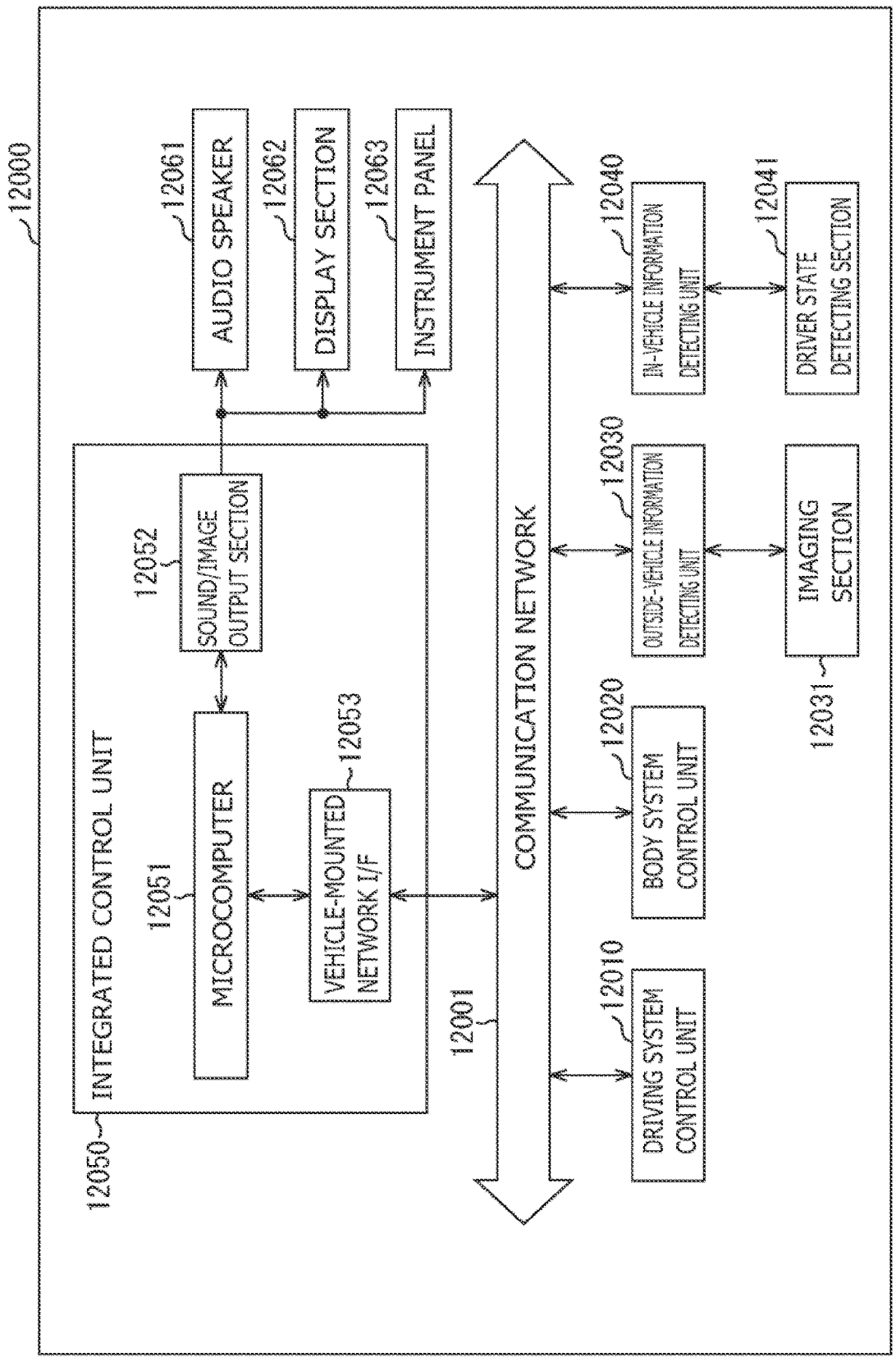
F I G. 24

SOLID-STATE IMAGING ELEMENT, IMAGING DEVICE, AND METHOD FOR CONTROLLING SOLID-STATE IMAGING ELEMENT

CROSS REFERENCE TO RELATED APPLICATIONS

This application is a U.S. National Phase of International Patent Application No. PCT/JP2019/016089 filed on Apr. 15, 2019, which claims priority benefit of Japanese Patent Application No. JP 2018-134815 filed in the Japan Patent Office on Jul. 18, 2018. Each of the above-referenced applications is hereby incorporated herein by reference in its entirety.

TECHNICAL FIELD

The present technology relates to a solid-state imaging element, an imaging device, and a method for controlling the solid-state imaging element. Specifically, the present technology relates to a solid-state imaging element and an imaging device in which an analog signal is sampled and held to be converted to a digital signal and a method for controlling the solid-state imaging element.

BACKGROUND ART

In the past, in order to reduce a fixed pattern noise, CDS (Correlated Double Sampling) processing, which obtains a difference between a signal voltage corresponding to a light reception amount and a reset voltage when pixels are initialized, has been performed in a solid-state imaging element. For example, a solid-state imaging element in which an analog signal voltage and an analog reset voltage are sampled and held and a current obtained by voltage-current conversion of the difference between these voltages is inputted to an analog-to-digital converter (ADC) has been proposed (for example, see PTL 1).

CITATION LIST

Patent Literature

[PTL 1]
U.S. Pat. No. 9,525,837

SUMMARY

Technical Problems

In the abovementioned related technology, a fixed pattern noise is reduced as a result of execution of CDS processing, whereby an image quality of image data can be improved. However, there is a possibility that conversion accuracy of the ADC is deteriorated by an influence of a dark current noise. For example, when a dark current is large, there is a possibility that, due to the dark current, an analog signal (e.g., a current) that is inputted to the ADC is increased to fall outside an input range of the ADC. Accordingly, the conversion accuracy may be deteriorated. Here, the input range means a range of an analog signal that can be AD-converted by the ADC with sufficient accuracy. If the input range of the ADC is widened to inhibit deterioration of the conversion accuracy, power consumption of the ADC is unfavorably increased. Therefore, in the related technology described above, it is difficult to inhibit deterioration of the conversion accuracy of the ADC caused by a dark current.

The present technology has been made in view of such circumstances, and an object thereof is to, in a solid-state imaging element in which an ADC is disposed, inhibit deterioration of conversion accuracy of an ADC caused by a dark current.

Solution to Problems

The present technology has been made in order to solve the abovementioned problems, and a first aspect of the present technology is a solid-state imaging element and a method for controlling the same. The solid-state imaging element includes a signal voltage sample-and-hold circuit that samples and holds, as a sample signal voltage, a voltage obtained by dividing a difference between a voltage of a vertical signal line corresponding to a light reception amount in a pixel and a predetermined variable reference voltage, an analog-to-digital converter that converts an analog signal corresponding to the sample signal voltage to a digital signal, and a reference voltage control section that performs control to modulate a value of the variable reference voltage according to a dark current amount in the pixel. This provides an effect that an amount corresponding to a dark current is corrected by modulation of the variable reference voltage.

In addition, in the first aspect, the pixel may include either an effective pixel which is not shielded from light or a light shielded pixel which is shielded from light, and the reference voltage control section may measure the dark current amount from the digital signal corresponding to the light shielded pixel. This provides an effect that the variable reference voltage is modulated according to the dark current amount measured from the digital signal of the light shielded pixel.

In addition, in the first aspect, the solid-state imaging element may further include a reset voltage sample-and-hold circuit that samples and holds, as a sample reset voltage, a voltage obtained by dividing a difference between a voltage of the vertical signal line when the pixel is initialized and a predetermined fixed reference voltage, and a differential conversion circuit that converts a difference between the sample signal voltage and the sample reset voltage to a current signal and supplies the current signal as the analog signal to the analog-to-digital converter. This provides an effect that CDS processing is executed.

In addition, in the first aspect, the pixels may be arranged into a two-dimensional lattice-like shape in a pixel array section, a pair of the signal voltage sample-and-hold circuits and a pair of the reset voltage sample-and-hold circuits may be disposed for each of columns that include the pixels and that are arranged in a predetermined direction in the pixel array section, during a sample period in one signal voltage sample-and-hold circuit of the pair, the other signal voltage sample-and-hold circuit may hold the sample signal voltage, and, during a sample period of one reset voltage sample-and-hold circuit of the pair, the other reset voltage sample-and-hold circuit may hold the sample reset voltage. This provides an effect that voltage sampling and voltage holding are performed in parallel.

In addition, in the first aspect, the pixels may be arranged on a predetermined light receiving board, and the signal voltage sample-and-hold circuit, the analog-to-digital converter, and the reference voltage control section may be disposed on a predetermined circuit board that is layered on the light receiving board. This provides an effect that the variable reference voltage is modulated in the solid-state imaging element having a layered structure.

In addition, in the first aspect, the solid-state imaging element may further include a memory that holds the digital signal. The memory may be disposed on a predetermined memory board. This provides an effect that the variable reference voltage is modulated in the solid-state imaging element having a layered structure formed of three layers.

In addition, in the first aspect, the solid-state imaging element may further include a reference voltage generating section that generates the variable reference voltage, under control of the reference voltage control section, and supplies the variable reference voltage to the signal voltage sample-and-hold circuit. This provides an effect that, as a result of modulation of the variable reference voltage from the reference voltage generating section, an amount corresponding to a dark current is corrected.

Further, a second aspect of the present technology is an imaging device including a signal voltage sample-and-hold circuit that samples and holds, as a sample signal voltage, a voltage obtained by dividing a difference between a voltage of a vertical signal line corresponding to a light reception amount in a pixel and a predetermined variable reference voltage, an analog-to-digital converter that converts an analog signal corresponding to the sample signal voltage to a digital signal, a reference voltage control section that performs control to modulate a value of the variable reference voltage according to a dark current amount in the pixel, and a digital signal processing circuit that processes the digital signal. This provides an effect that a digital signal in which an amount corresponding to a dark current has been corrected as a result of modulation of the variable reference voltage is processed.

Advantageous Effect of Invention

The present technology can provide a prominent effect that, in a solid-state imaging element in which an ADC is disposed, deterioration of conversion accuracy of the ADC caused by a dark current can be inhibited. It is to be noted that the effect disclosed above is not necessarily limitative, and it is sufficient that any one of effects disclosed in the present disclosure is provided.

BRIEF DESCRIPTION OF DRAWINGS

FIG. 24 is a block diagram depicting an example of schematic configuration of a vehicle control system.

DESCRIPTION OF EMBODIMENTS

Hereinafter, an explanation will be given of modes for carrying out the present technology (hereinafter, referred to as embodiments). The explanation will be given in the following order.

1. First Embodiment (example of modulating a variable reference voltage according to a dark current amount)
2. Second Embodiment (example of modulating a variable reference voltage according to a dark current amount in a solid-state imaging element having a layered structure)
3. Third Embodiment (example of modulating a variable reference voltage according to a dark current amount and executing sampling and AD conversion in parallel)
4. Modification 1. First Embodiment

[Configuration Example of Imaging Device]

Figure 1:
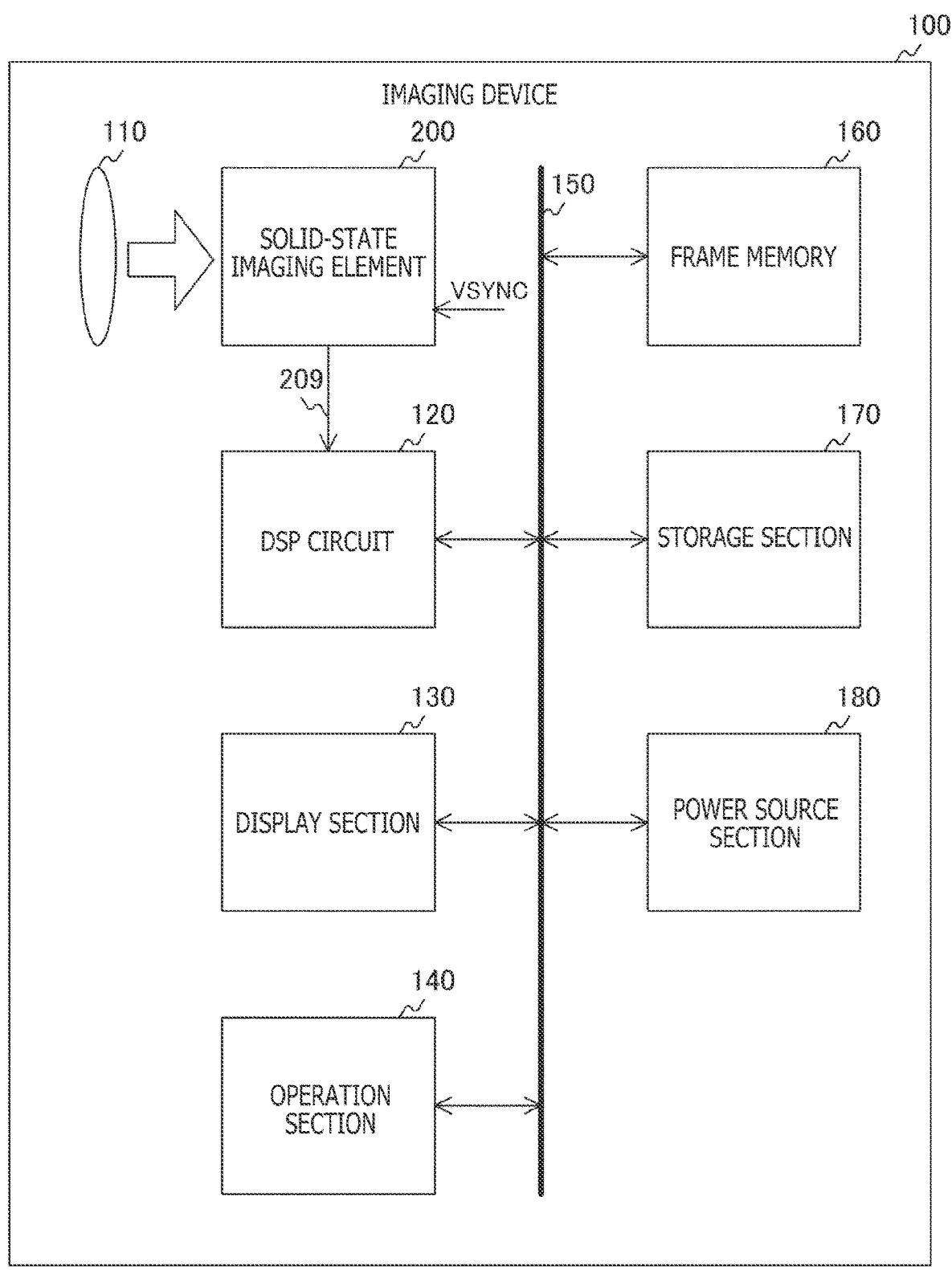
FIG. 1 is a block diagram depicting one configuration example of an imaging device according to a first embodiment of the present technology.

FIG. 1 is a block diagram depicting one example of an imaging device 100 according to a first embodiment of the present technology. The imaging device 100 is a device for performing imaging to obtain image data and includes an optical section 110, a solid-state imaging element 200, and a DSP (Digital Signal Processing) circuit 120. Further, the imaging device 100 includes a display section 130, an operation section 140, a bus 150, a frame memory 160, a storage section 170, and a power source section 180. It is assumed that a camera to be installed on an industrial robot, an on-vehicle camera, or the like is used as the imaging device 100.

The optical section 110 is configured to collect light from a subject and guide the light to the solid-state imaging element 200. The solid-state imaging element 200 is configured to generate image data by performing photoelectric conversion. The solid-state imaging element 200 generates image data and supplies the image data to the DSP circuit 120 via a signal line 209.

The DSP circuit 120 is configured to perform predetermined signal processing on the image data. The DSP circuit 120 outputs the processed image data to the frame memory 160, etc., via the bus 150. It is to be noted that the DSP circuit 120 is one example of the signal processing section set forth in the claims.

The display section 130 is configured to display the image data. It is assumed that a liquid crystal panel or an organic EL (Electro Luminescence) panel is used as the display section 130, for example. The operation section 140 is configured to generate an operation signal according to a user operation.

The bus 150 is a common path for data exchange between the optical section 110, the solid-state imaging element 200, the DSP circuit 120, the display section 130, the operation section 140, the frame memory 160, the storage section 170, and the power source section 180.

The frame memory 160 is configured to hold image data. The storage section 170 is configured to store various pieces of data including image data. The power source section 180 is configured to supply power to the solid-state imaging element 200, the DSP circuit 120, and the display section 130, etc.

[Configuration Example of Solid-State Imaging Element]

Figure 2:
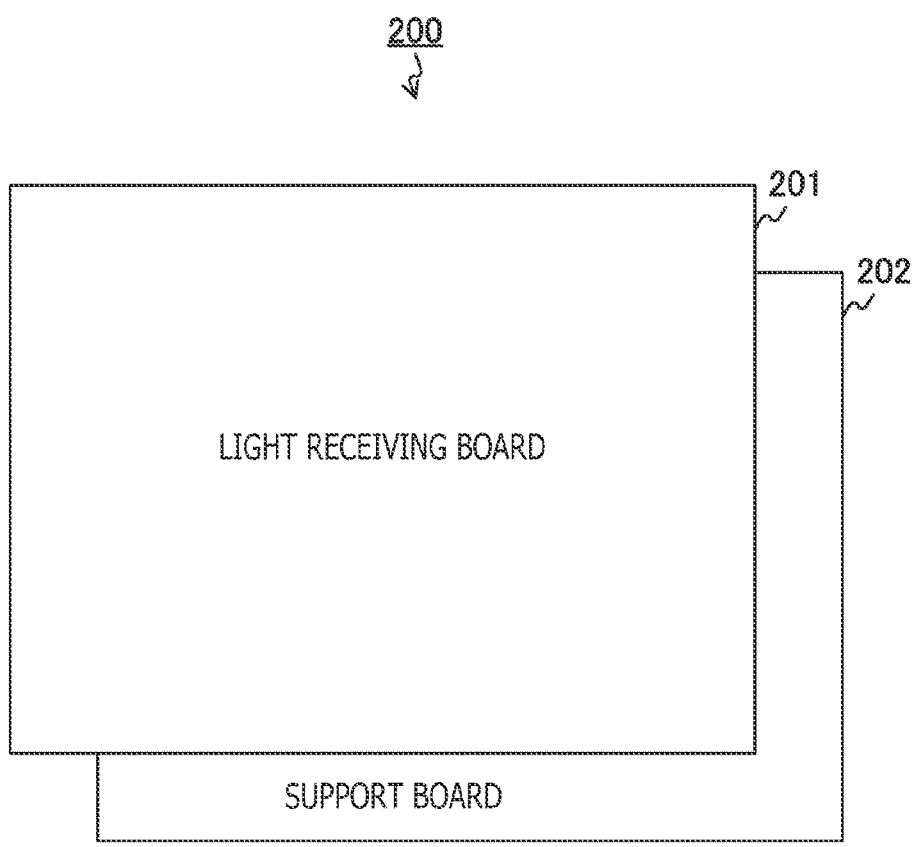
FIG. 2 is a diagram depicting one example of a layered structure of a solid-state imaging element according to the first embodiment of the present technology.

FIG. 2 is a diagram depicting one example of a layered structure of the solid-state imaging element 200 according to the first embodiment of the present technology. The solid-state imaging element 200 includes a light receiving board 201 and a support board 202 that is layered on the light receiving board 201.

Figure 3:
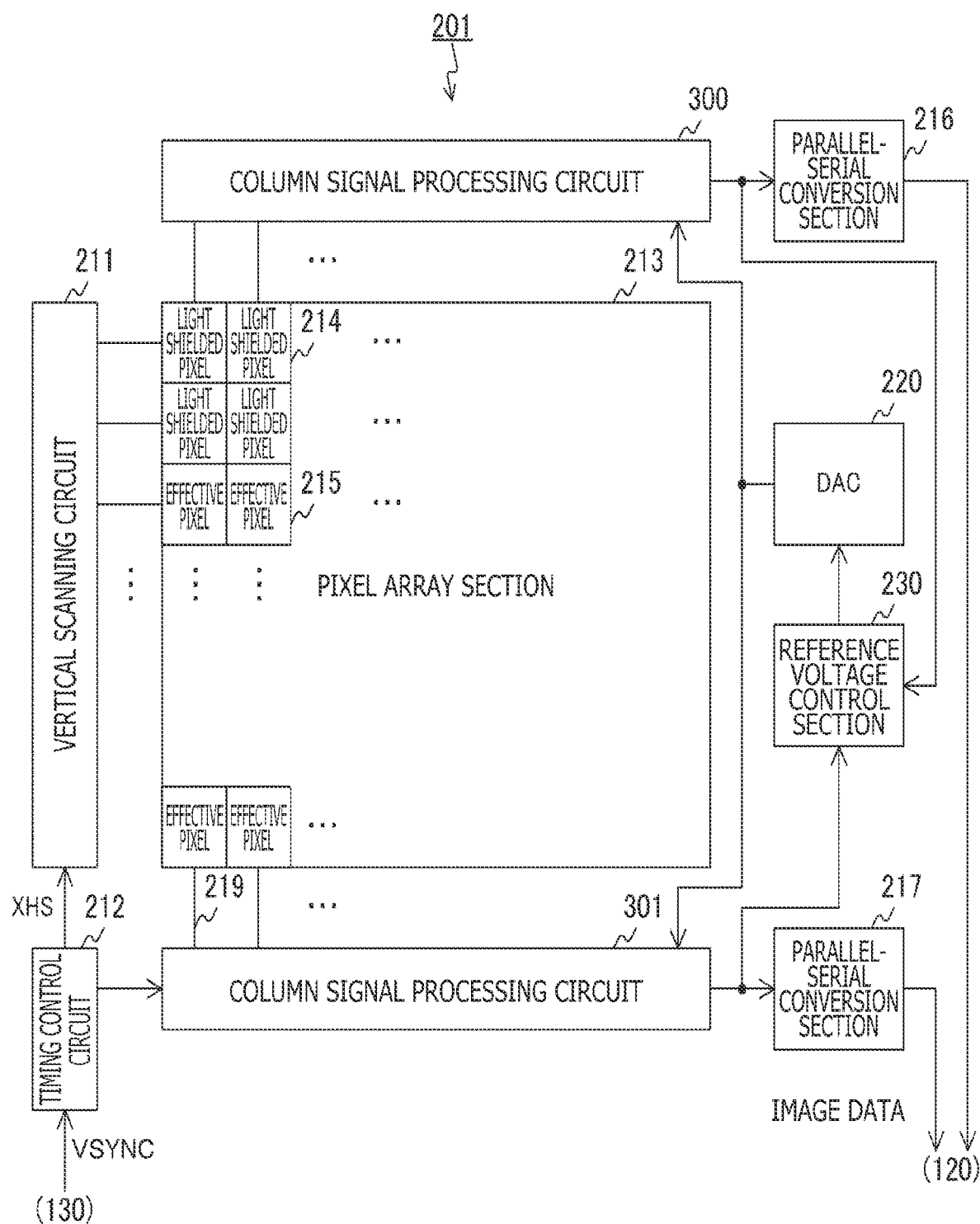
FIG. 3 is a diagram depicting one example of circuits disposed on a light receiving board according to the first embodiment of the present technology.

FIG. 3 is a diagram depicting one example of circuits disposed on the light receiving board 201 according to the first embodiment of the present technology. A vertical scanning circuit 211, a timing control circuit 212, a pixel array section 213, a DAC 220, and a reference voltage control section 230 are disposed on the light receiving board 201. Further, column signal processing circuits 300 and 301 and parallel-serial conversion sections 216 and 217 are disposed on the light receiving board 201.

In the pixel array section 213, a plurality of pixels is arranged into a two-dimensional lattice-like shape. Hereinafter, a set of pixels arranged in a horizontal direction is referred to as a "row," and a set of pixels arranged in a vertical direction is referred to as a "column." Also, among of the rows consist of light shielded pixels 214 that are shielded from light, and the remaining rows consist of effective pixels 215 that are not shielded from light. The number of the rows consisting of light shielded pixels 214 is typically less than the number of the rows consisting of the effective pixels 215.

It is to be noted that columns consisting of the light shielded pixels 214 may be arranged in place of the rows consisting of the light shielded pixels 214. Also, both rows consisting of the light shielded pixels 214 and columns consisting of the light shielded pixels 214 may be arranged.

The timing control circuit 212 is configured to control respective operation timings of the circuits in the solid-state imaging element 200 in synchronization with a vertical synchronization signal VSYNC. The vertical synchronization signal VSYNC is a periodic signal indicating an imaging timing of image data and has a frequency of 60 Hz, for example.

The vertical scanning circuit 211 is configured to sequentially select and drive the rows. The vertical scanning circuit 211 repeats a process of selecting and driving two rows simultaneously. The driven pixels each output an analog signal to the column signal processing circuit 300 or 301.

The column signal processing circuit 300 is configured to perform CDS processing and AD conversion processing on analog signals from odd-number rows. The column signal processing circuit 300 parallelly transfers digital signals obtained as a result of the processing to the parallel-serial conversion section 216.

The column signal processing circuit 301 is configured to perform CDS processing and AD conversion processing on analog signals from even-number rows. The column signal processing circuit 301 parallelly transfers digital signals obtained as a result of the processing to the parallel-serial conversion section 217.

The parallel-serial conversion sections 216 and 217 are configured to perform parallel-serial conversion on the parallelly transferred digital signals. The parallel-serial conversion sections 216 and 217 each serially transfer image data including the digital signals having undergone the parallel-serial conversion to the DSP circuit 120.

The DAC 220 is configured to generate a predetermined variable reference voltage, under control of the reference voltage control section 230, and supply the variable reference voltage to the column signal processing circuits 300 and 301. It is to be noted that the DAC 220 is one example of the reference voltage generating section set forth in the claims.

The reference voltage control section 230 is configured to perform control to modulate the value of the variable reference voltage according to a dark current amount in pixels.

It is to be noted that, in the solid-state imaging element 200, the column signal processing circuits 300 and 301 are disposed to drive two rows simultaneously, but only either one of the column signal processing circuits may be disposed to sequentially drive one row by one row. In this case, either one of the parallel-serial conversion sections 216 and 217 is unnecessary.

[Configuration Example of Column Signal Processing Circuit]

Figure 4:
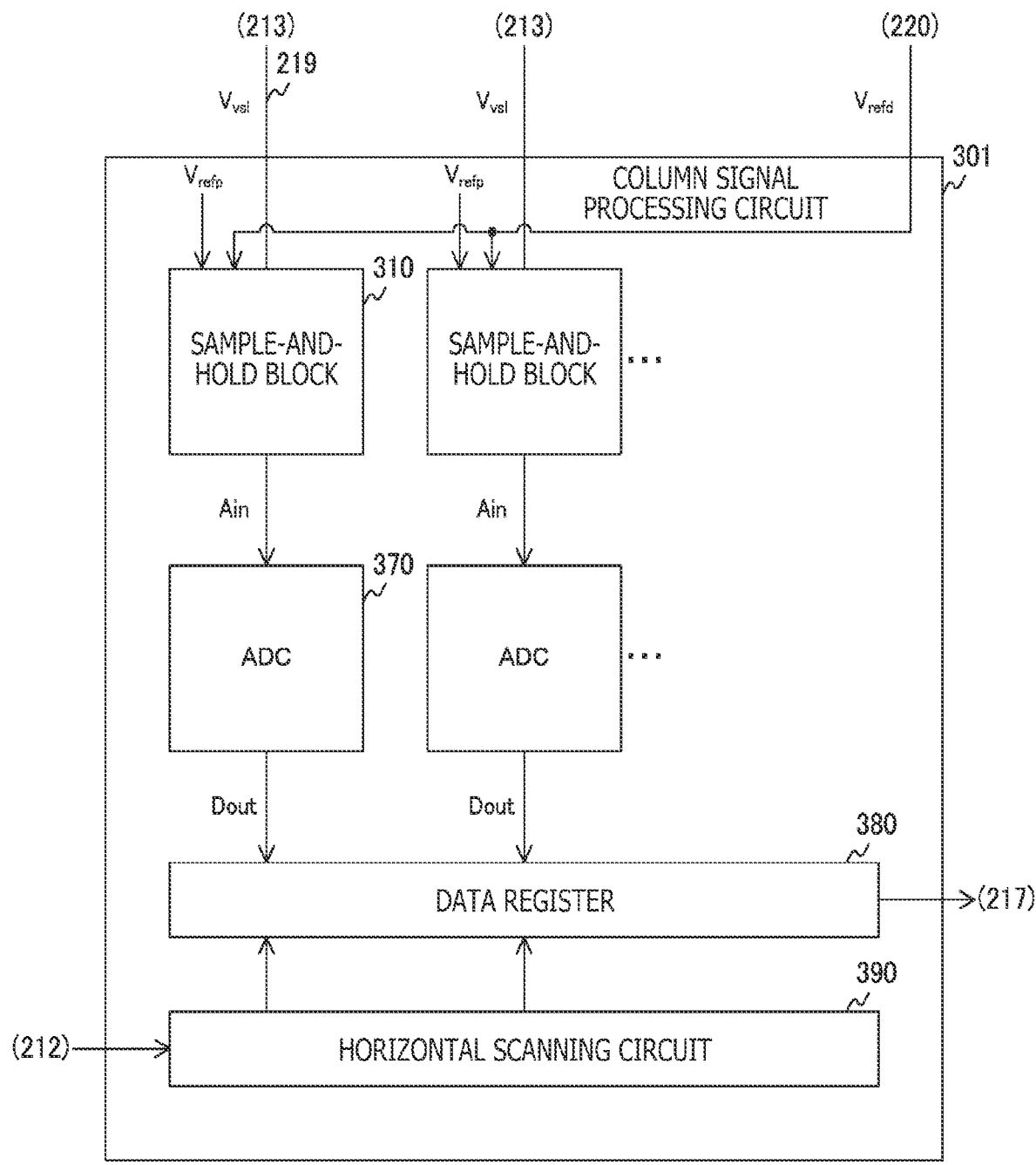
FIG. 4 is a block diagram depicting one configuration example of a column signal processing section according to the first embodiment of the present technology.

FIG. 4 is a block diagram depicting one configuration example of the column signal processing circuit 301 according to the first embodiment of the present technology. The column signal processing circuit 301 includes a plurality of sample-and-hold blocks 310, a plurality of ADCs 370, a data register 380, and a horizontal scanning circuit 390. The sample-and-hold blocks 310 and the ADCs 370 are arranged for respective columns. For example, when the number of columns is N (N is an integer), N sample-and-hold blocks 310 and N ADCs 370 are arranged. It is to be noted that the configuration of the column signal processing circuit 300 is similar to that of the column signal processing circuit 301.

Also, in the pixel array section 213, vertical signal lines 219 are laid for respective columns. The sample-and-hold blocks 310 are connected to corresponding columns via the vertical signal lines 219.

The sample-and-hold blocks 310 are configured to sample and hold voltages corresponding to the voltages $V_{vsl}$ of the corresponding vertical signal lines 219. A fixed reference voltage $V_{refp}$ that is kept constant and a variable reference voltage $V_{refd}$ from the DAC 220 are inputted to each of the sample-and-hold blocks 310. Each of the sample-and-hold blocks 310 generates an analog current signal Ain by performing CDS processing, with use of the fixed reference voltage $V_{refp}$ and the variable reference voltage $V_{refd}$. A method for using the reference voltages will be described later in detail.

The ADCs 370 are each configured to convert the current signal Ain to a digital signal Dout. The ADCs 370 each supply the digital signal Dout to the data register 380.

The data register 380 holds the digital signals Dout of the respective columns and sequentially transfers the digital signals Dout to the parallel-serial conversion section 217, under control of the horizontal scanning circuit 390.

The horizontal scanning circuit 390 is configured to control the data register 380 to sequentially transfer digital signals.

[Configuration Example of Sample-and-Hold Block]

Figure 5:
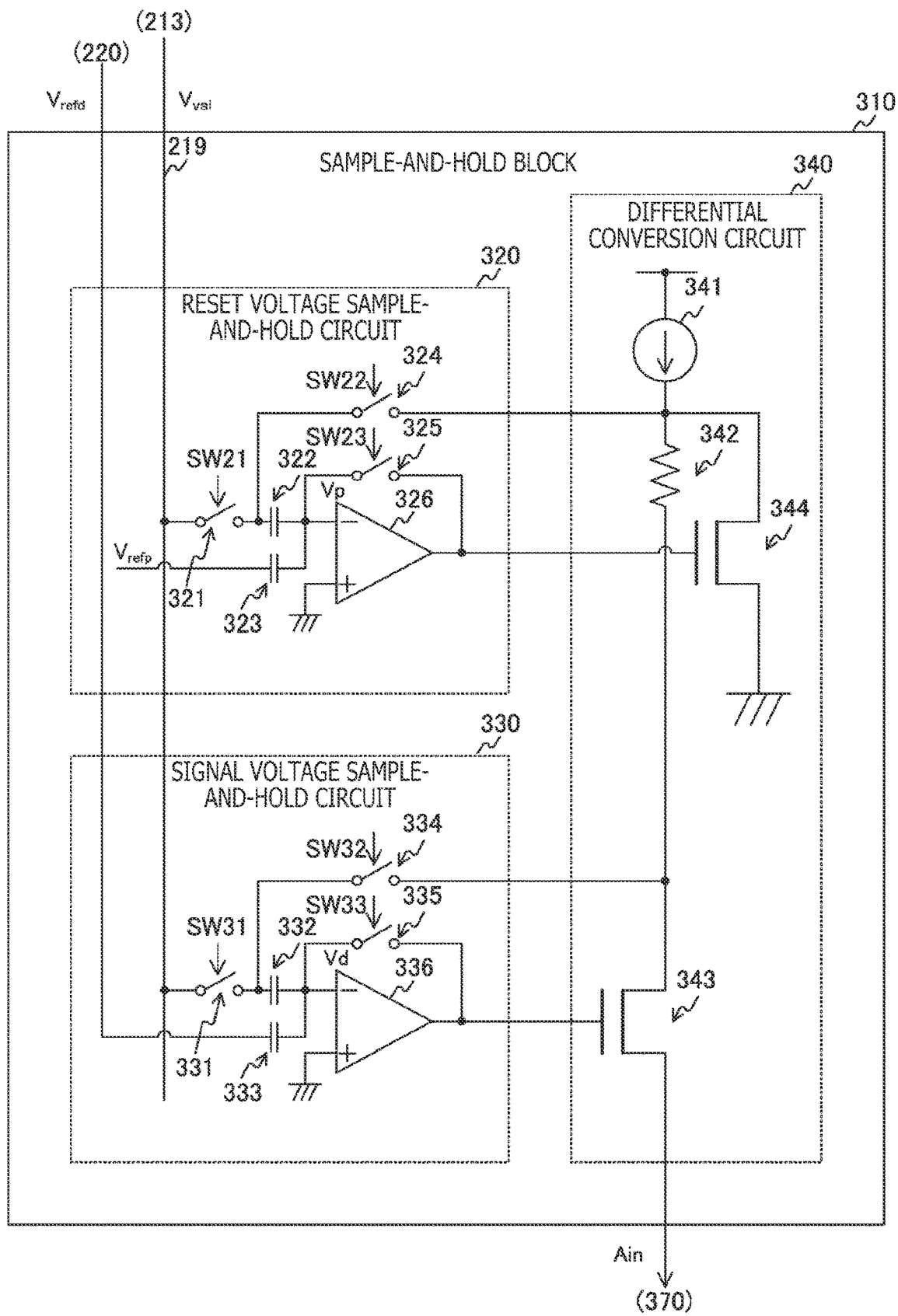
FIG. 5 is a circuit diagram depicting one configuration example of a sample-and-hold block according to the first embodiment of the present technology.

FIG. 5 is a circuit diagram depicting one configuration example of the sample-and-hold block 310 according to the first embodiment of the present technology. The sample-and-hold block 310 includes a reset voltage sample-and-hold circuit 320, a signal voltage sample-and-hold circuit 330, and a differential conversion circuit 340.

The reset voltage sample-and-hold circuit 320 includes switches 321, 324, and 325, capacitors 322 and 323, and an amplifier 326. The signal voltage sample-and-hold circuit 330 includes switches 331, 334, and 335, capacitors 332 and 333, and an amplifier 336. The differential conversion circuit 340 includes a current source 341, a resistor 342, and N-type transistors 343 and 344.

The switch 321 is configured to switch a path between the vertical signal line 219 and the capacitor 322 according to a control signal SW21 from the timing control circuit 212.

The capacitor 322 is interposed between the switch 321 and an inverted input terminal (−) of the amplifier 326. The fixed reference voltage $V_{refp}$ is inputted to one end of the capacitor 323, and the other end of the capacitor 323 is connected, in parallel with the capacitor 322, to the inverted input terminal (−) of the amplifier 326.

The switch 324 is configured to switch between a connection point between the switch 321 and the capacitor 322 and a connection point between the current source 341 and the resistor 342 according to a control signal SW22 from the timing control circuit 212.

The switch 325 is configured to switch a path between the inverted input terminal (−) of the amplifier 326 and an output terminal thereof according to a control signal SW23 from the timing control circuit 212.

The amplifier 326 is configured to amplify a difference between the connection point between the capacitors 322 and 323 and a ground voltage. An output terminal of the amplifier 326 is connected to a gate of the N-type transistor 344.

The configuration of the signal voltage sample-and-hold circuit 330 is similar to that of the reset voltage sample-and-hold circuit 320. However, the variable reference voltage $V_{refd}$ from the DAC 220 is inputted to one end of the capacitor 333. In addition, one end of the switch 334 is connected to the connection point between the resistor 342 and the N-type transistor 343, and the output terminal of the amplifier 336 is connected to a gate of the N-type transistor 343.

The current source 341, the resistor 342, and the N-type transistor 343 in the differential conversion circuit 340 are connected in series to a power source. Further, each of the N-type transistors has a drain connected to a connection point between the current source 341 and the resistor 342 and has a grounded source.

Here, a voltage $V_{vsl}$ of the vertical signal line 219 becomes a reset voltage $V_{vslp}$ when the pixels are initialized, and the reset voltage $V_{vslp}$ is shifted to a signal voltage $V_{vsld}$ when light exposure is finished. The signal voltage $V_{vsld}$ is a voltage that corresponds to the exposure amount when the exposure is finished.

Before the reset voltage $V_{vslp}$ is sampled, the timing control circuit 212 performs control to close the switches 325 and 335 and obtain auto-zero states of the amplifiers 326 and 336.

Then, the timing control circuit 212 closes only the switch 321 and opens the remaining switches when the pixels are initialized. Accordingly, a difference between the reset voltage $V_{vslp}$ and the fixed reference voltage $V_{refp}$ is sampled by the capacitors 322 and 323. Further, a voltage obtained by dividing the difference is sampled by the capacitor 323. Hereinafter, this divided voltage is referred to as a "sample reset voltage Vp."

Next, the timing control circuit 212 closes only the switch 331 and opens the remaining switches when exposure is finished. Accordingly, a difference between the signal voltage $V_{vsld}$ and the variable reference voltage $V_{refd}$ is sampled by the capacitors 332 and 333. Further, a divided voltage of the difference is sampled by the capacitor 333. Hereinafter, this divided voltage is referred to as a "sample signal voltage Vd."

Further, the reference voltage control section 230 performs control to modulate the value of the variable reference voltage $V_{refd}$ according to a dark current amount, immediately after an AD period for performing AD conversion. A variable reference voltage $V_{refd}$ prior to the modulation is defined as $V_{ref0}$, and a modulated variable reference voltage $V_{refd}$ is defined as $V_{ref1}$. Accordingly, the value of the sample signal voltage Vd is changed to Vd'.

Then, the timing control circuit 212 closes the switches 324 and 334 and opens the remaining switches during an AD period. Accordingly, the sample reset voltage Vp and the sample signal voltage Vd' are held, and the amplifiers 326 and 336 amplify and output these voltages.

The differential conversion circuit 340 converts a difference between the voltage obtained by amplifying the sample reset voltage Vp and the voltage obtained by amplifying the sample signal voltage Vd' to a current and outputs the current as the current signal Ain to the ADC 370. That is, CDS processing and current-voltage conversion processing are performed.

[Configuration Example of Reference Voltage Control Section]

Figure 6:
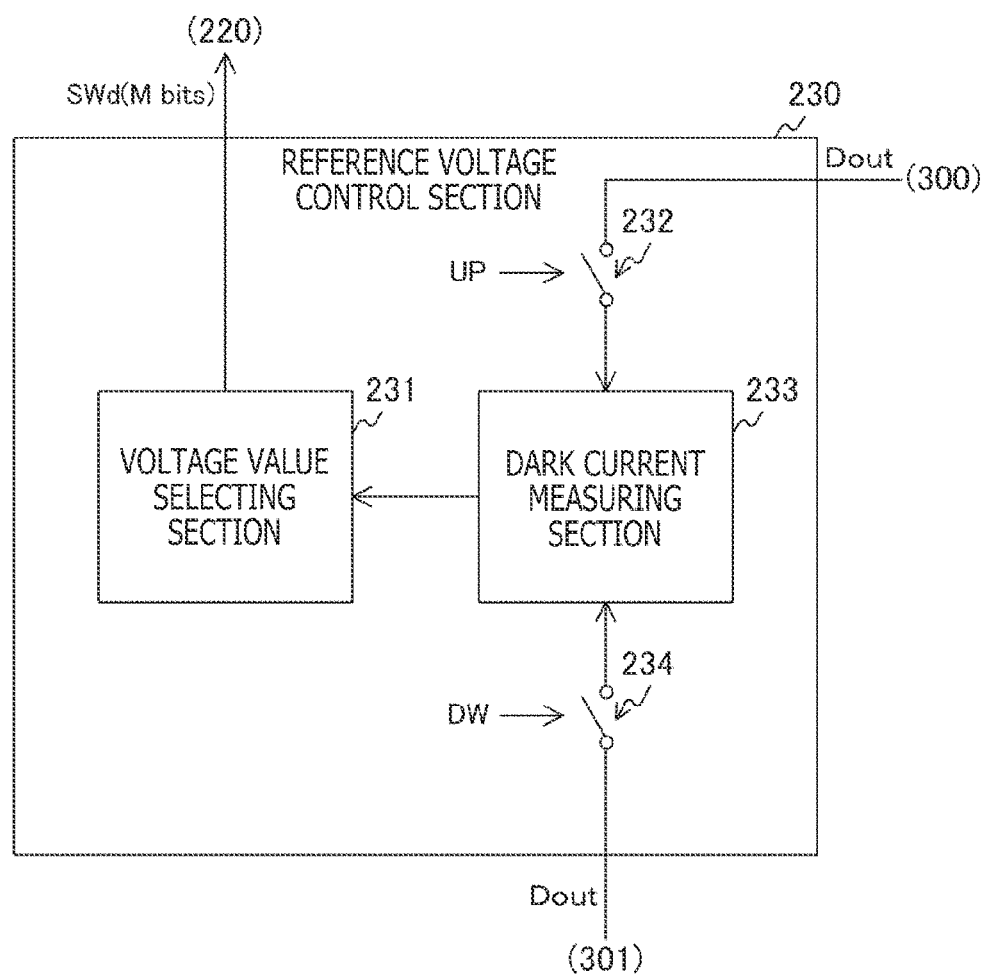
FIG. 6 is a block diagram depicting one configuration example of a reference voltage control section according to the first embodiment of the present technology.

FIG. 6 is a block diagram depicting one configuration example of the reference voltage control section 230 according to the first embodiment of the present technology. The reference voltage control section 230 includes a voltage value selecting section 231, switches 232 and 234, and a dark current measuring section 233.

The switch 232 is configured to switch a path between the column signal processing circuit 300 and the dark current measuring section 233 according to a control signal UP from the timing control circuit 212.

The switch 234 is configured to switch a path between the column signal processing circuit 301 and the dark current measuring section 233 according to a control signal DW from the timing control circuit 212.

The timing control circuit 212 performs control to close the switch 232 when a digital signal Dout corresponding to the light shielded pixels 214 is outputted from the column signal processing circuit 300. Further, the timing control circuit 212 performs control to close the switch 234 when a digital signal Dout corresponding to the light shielded pixels 214 is outputted from the column signal processing circuit 301.

The dark current measuring section 233 is configured to measure a dark current amount from the digital signals Dout corresponding to the light shielded pixels 214. For example, a statistical amount (e.g., total value and mean value) of the digital signals Dout is calculated as the dark current amount. The dark current measuring section 233 supplies the calculated dark current amount to the voltage value selecting section 231.

The voltage value selecting section 231 is configured to perform control to modulate the variable reference voltage $V_{refd}$ according to the dark current amount by an M-bit (M is an integer) selection signal SWd, immediately after an AD conversion period. The voltage value selecting section 231 generates a selection signal SWd for selecting a lower voltage value when the dark current amount is larger, for example, and supplies the selection signal SWd to the DAC 220.

[Configuration Example of DAC]

Figure 7:
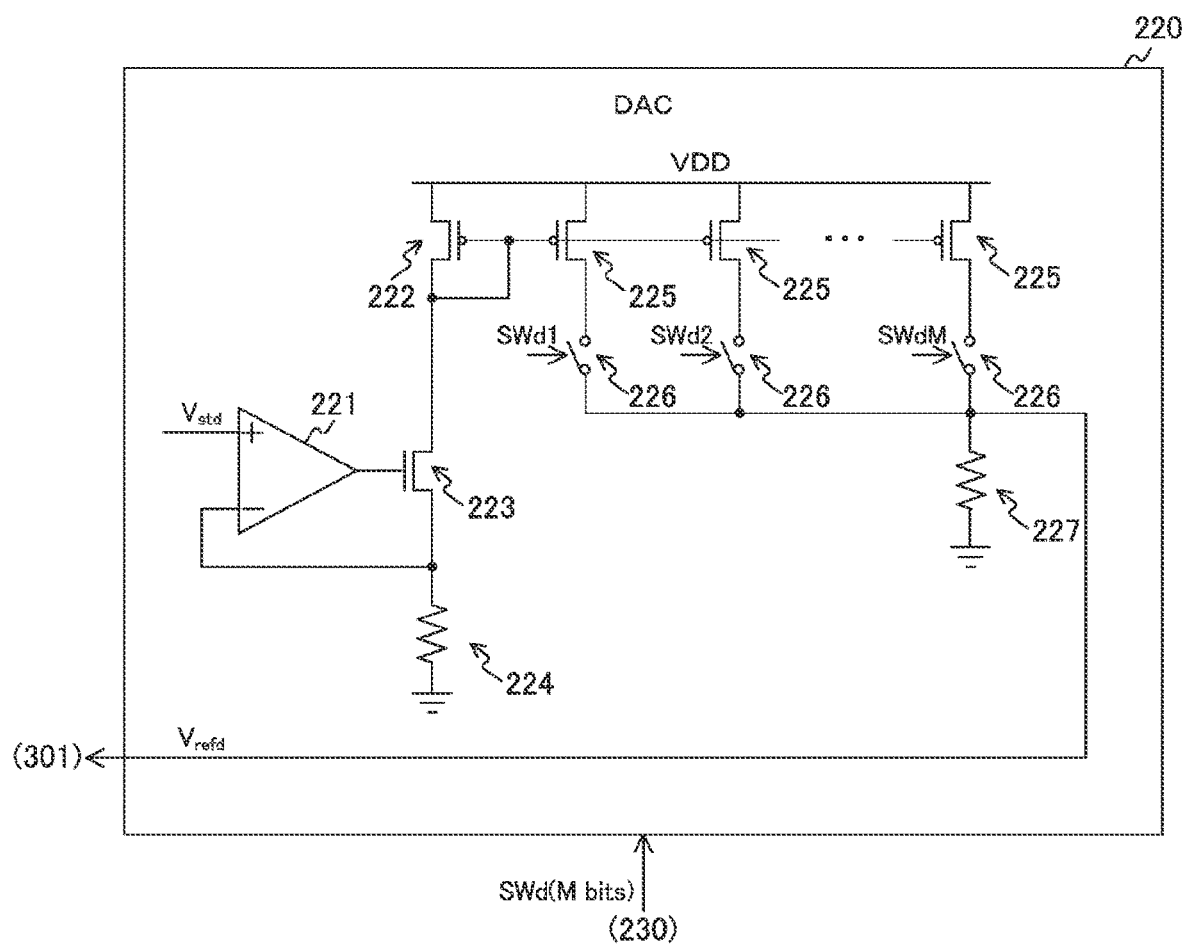
FIG. 7 is a circuit diagram depicting one example of a DAC (Digital-to-Analog Converter) according to the first embodiment of the present technology.

FIG. 7 is a circuit diagram depicting one configuration example of the DAC 220 according to the first embodiment of the present technology. The DAC 220 includes an amplifier 221, a P-type transistor 222, an N-type transistor 223, and a resistor 224. Further, the DAC 220 includes M sets each including a P-type transistor 225 and a switch 226.

The P-type transistor 222 and the M P-type transistors 225 are parallelly connected to a power source. In addition, gates of these transistors are connected. The gate of the P-type transistor 222 is also connected to the drain of the P-type transistor 222 itself.

The N-type transistor 223 and the resistor 224 are connected in series between the drain of the P-type transistor 222 and a ground terminal. Also, a predetermined reference voltage $V_{std}$ is inputted to an inverted input terminal (−) of the amplifier 221, and a non-inverted input terminal (+) of the amplifier 221 is connected to a connection point between the N-type transistor 223 and the resistor 224. Further, an output terminal of the amplifier 221 is connected to a gate of the N-type transistor 223.

Respective drains of the M P-type transistors 225 are all connected to one end of a resistor 227 via the corresponding switches 226. The other end of the resistor 227 is connected to the ground terminal. The voltage at a connection point between each of the switches 226 and the resistor 227 is outputted, as the variable reference voltage $V_{refd}$, to the column signal processing circuits 300 and 301.

The m-th (m is an integer of 1 to M) switch 226 switches a path between the corresponding P-type transistor 225 and the resistor 227 according to an m-th bit value in the selection signal SWd.

In the abovementioned configuration, M copies of a current corresponding to the reference voltage $V_{std}$ are made by a current mirror circuit including the P-type transistor 222 and the M P-type transistors 225. The reference voltage control section 230 adjusts the number of switches, among the M switches 226, to be closed according to the selection signal SWd so that the amount of current flowing through the resistor 227 can be controlled. Accordingly, the variable reference voltage $V_{refd}$ can be modulated.

It is to be noted that the DAC 220 can further generate the fixed reference voltage $V_{refp}$ and can supply the fixed reference voltage $V_{refp}$ to the column signal processing circuits 300 and 301.

Figure 8:
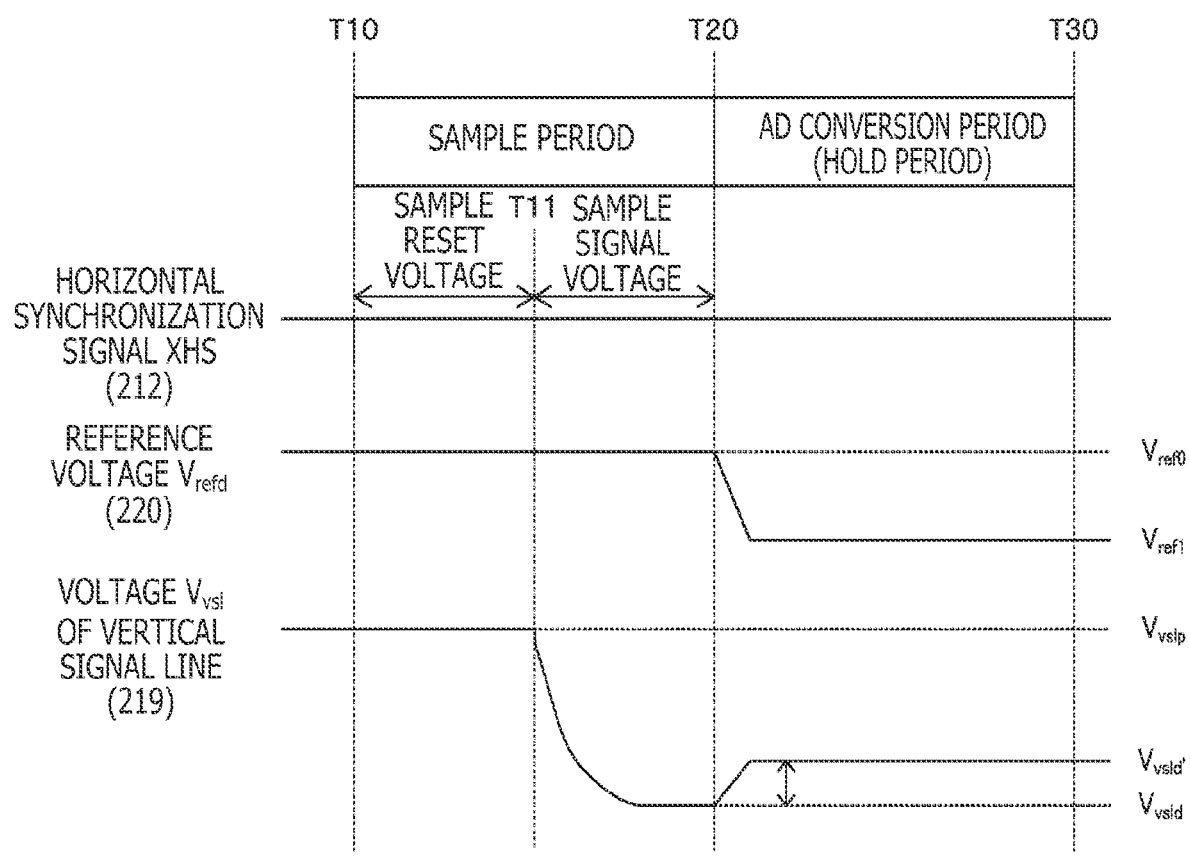
FIG. 8 is a timing chart depicting one example of operation of the solid-state imaging element according to the first embodiment of the present technology.

FIG. 8 is a timing chart depicting one example of operation of the solid-state imaging element 200 according to the first embodiment of the present technology. The timing control circuit 212 generates a horizontal synchronization signal XHS by multiplying the vertical synchronization signal VSYNC and supplies the horizontal synchronization signal XHS to the vertical scanning circuit 211. The rows are sequentially read out in synchronization with the horizontal synchronization signal XHS.

In a period from timing T10 to T30 corresponding to the cycle of a certain horizontal synchronization signal XHS, during a period from timing T10 to T11, the sample reset voltage Vp is sampled. Then, during a period from timing T11 to T20, the sample signal voltage Vd is sampled. Then, during a period from timing T20 to T30, the sampled voltages are held and AD conversion is performed on the voltages.

At timing T20, the DAC 220 modulates the value of the variable reference voltage $V_{refd}$ to $V_{ref1}$ according to a dark current amount, under control of the reference voltage control section 230.

Further, at timing T11, the voltage $V_{vsl}$ of the vertical signal line is shifted from the reset voltage $V_{vslp}$ to the signal voltage $V_{vsld}$. Then, at timing T20, the variable reference voltage $V_{refd}$ is modulated to be changed to $V_{vsld}'$.

Here, when the capacity values of the capacitors 332 and 333 in the signal voltage sample-and-hold circuit 330 are defined as Cfd and Csd, respectively, the following expression is established according to the charge conservation law:

$$Cfd(V_{vsld}-Vd)+Csd(V_{ref0}-Vd)=Cfd(V_{vsld}'-Vd)+Csd(V_{ref1}-Vd) \qquad \text{Expression 1}$$

In the above expression, $V_{vsld}$ represents the unmodulated voltage (signal voltage) of the vertical signal line 219, $V_{ref0}$ represents the unmodulated variable reference voltage $V_{refd}$, Vd represents the unmodulated voltage (i.e., sample signal voltage) of a connection point between the capacitors 332 and 333, $V_{vsld}'$ represents the modulated voltage of the vertical signal line 219, and $V_{ref1}$ represents the modulated variable reference voltage $V_{refd}$.

The following expression is obtained by deleting the sample signal voltage Vd from Expression 1:

$$Cfd \cdot V_{vsld} + Csd \cdot V_{ref0} = Cfd \cdot V_{vsld}' + Csd \cdot V_{ref1} \quad \text{Expression 2}$$

The following expression is obtained by transforming Expression 2:

$$V_{vsld}' = V_{vsld} + (Csd/Cfd)(V_{ref0} - V_{ref1}) \quad \text{Expression 3}$$

According to Expression 3, when the variable reference voltage $V_{refd}$ is lowered, the voltage $V_{vsl}$ of a vertical signal line can be increased according to the ratio of the capacity values.

If the variable reference voltage $V_{refd}$ is kept constant without being modulated, a current corresponding to the difference between the signal voltage $V_{vsld}$ and the reset voltage $V_{vslp}$ is inputted to the ADC 370. An input range of the ADC 370 is typically set to a range in which AD conversion can be performed with sufficient accuracy. When the dark current amount is large, the signal voltage $V_{vsld}$ is accordingly lowered so that the difference from the reset voltage $V_{vslp}$ becomes large. An increase of this difference may cause the current corresponding to the difference to fall outside the input range of the ADC 370. In this case, the conversion accuracy of the ADC 370 is deteriorated so that the image quality of image data is deteriorated.

In contrast, in the solid-state imaging element 200, the variable reference voltage $V_{refd}$ is lowered according to the dark current amount. As a result of modulation of the variable reference voltage $V_{refd}$, the voltage of the vertical signal line 219 is increased from $V_{vsld}$ to $V_{vsld}'$. Thus, the voltage is corrected to a value the difference of which from the reset voltage $V_{vslp}$ is small. Consequently, the current corresponding to the difference is prevented from falling outside the input range of the ADC 370 so that deterioration of the conversion accuracy of the ADC 370 caused by a dark current can be inhibited. It is to be noted that, when the input range is widened, deterioration of the conversion accuracy can be inhibited but power consumption of the ADC 370 is unfavorably increased.

According to Expression 3, when the capacity value Csd is sufficiently increased with respect to Cfd and the difference between the variable reference voltages $V_{ref0}$ and $V_{ref1}$ is increased according to the ratio of these capacity values, the influence of noise from another circuit such as the DAC 220 can be reduced.

Figure 9:
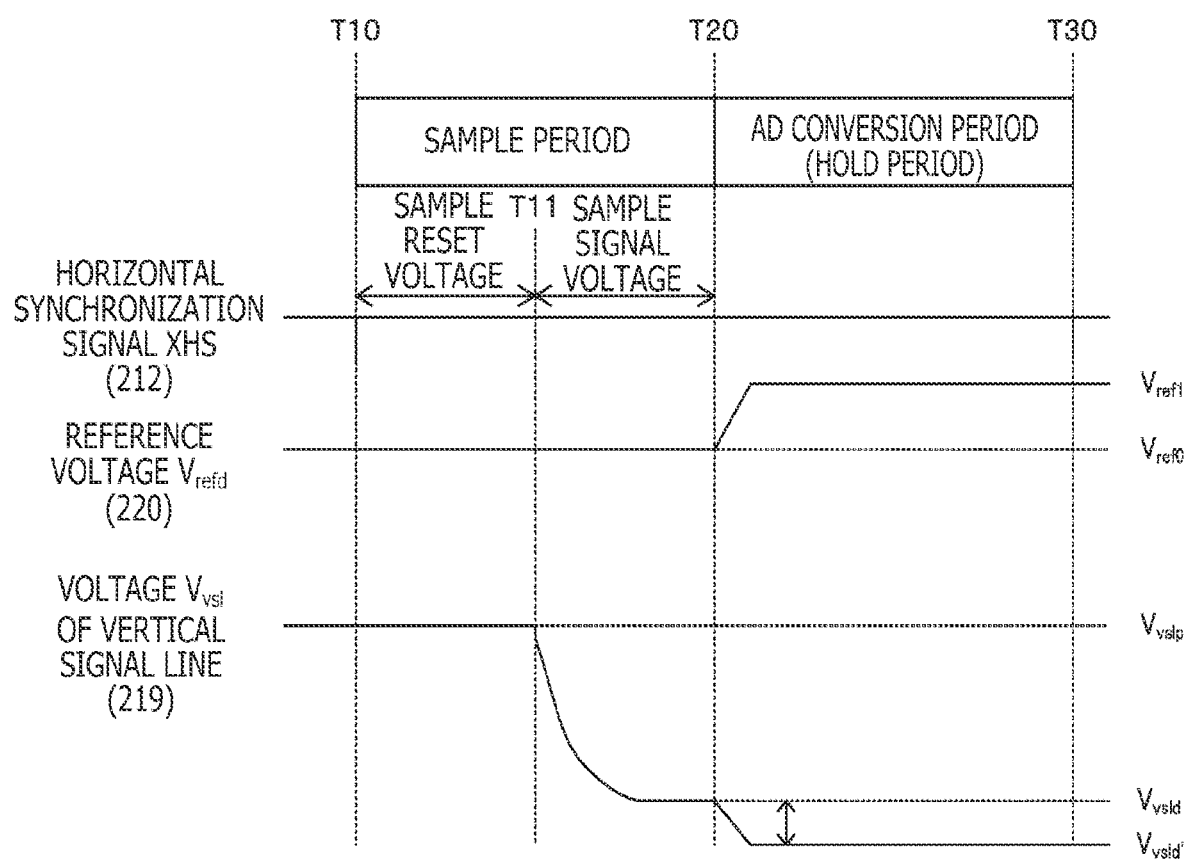
FIG. 9 is a timing chart depicting one example of operation of the solid-state imaging element in a case of increasing a variable reference voltage according to the first embodiment of the present technology.

It is known that the value of a signal voltage in each of the light shielded pixels 214 and the effective pixels 215 is normally equal to or higher than the reset voltage. However, there may be a case where the value of a signal voltage in the light shielded pixels 214 is lower than the reset voltage due to the influence of noise, etc. Such a case also can be addressed when the modulated variable reference voltage $V_{ref1}$ is set to be higher than the unmodulated variable reference voltage $V_{ref0}$, as depicted in FIG. 9.

Figure 10:
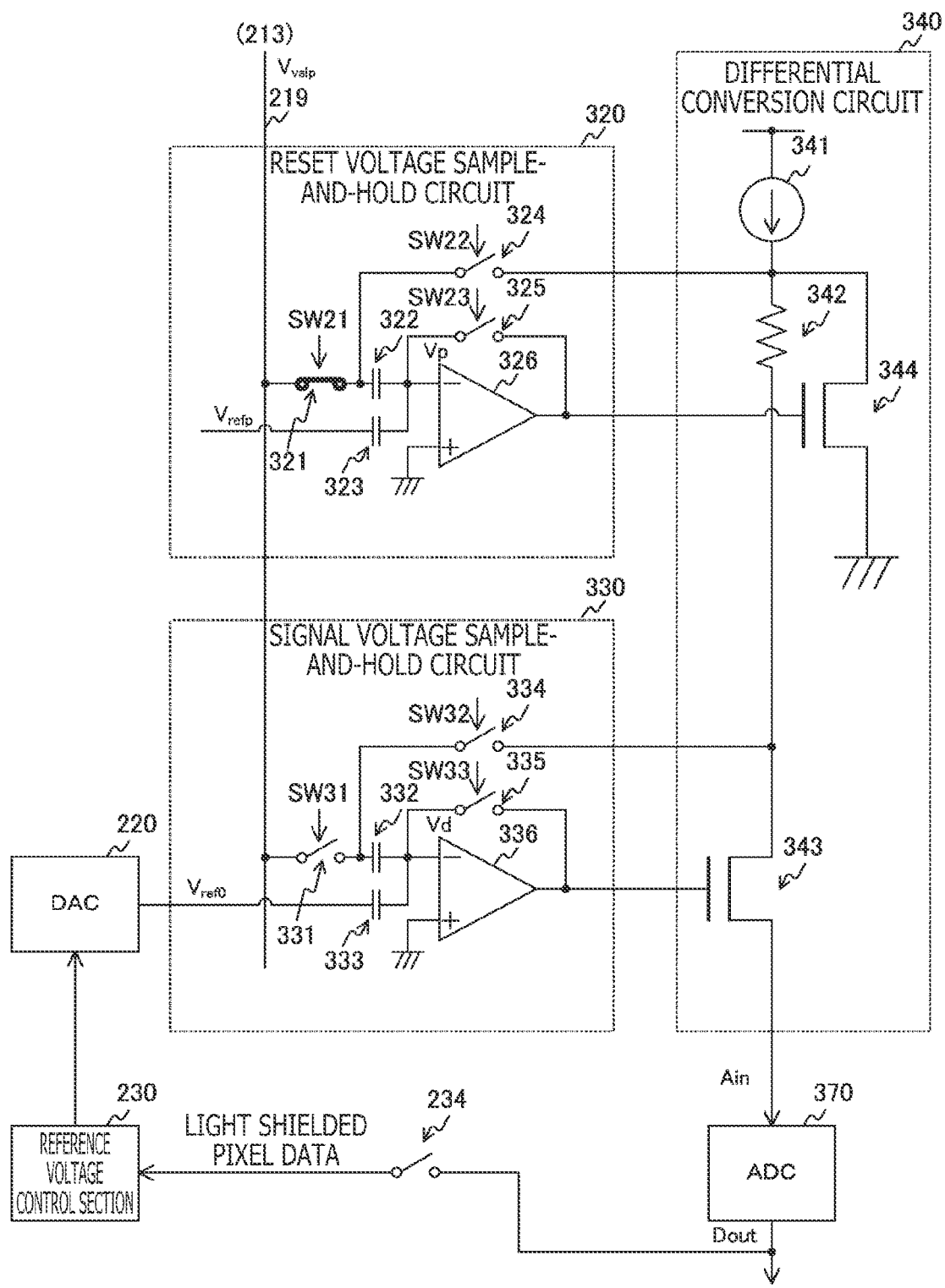
FIG. 10 is a diagram depicting one example of a state of the solid-state imaging element during a reset voltage sampling time according to the first embodiment of the present technology.

FIG. 10 is a diagram depicting one example of a state of the solid-state imaging element 200 during a reset voltage sampling time according to the first embodiment of the present technology. When the pixels are initialized, the timing control circuit 212 closes only the switch 321 and opens the remaining switches. Accordingly, a voltage obtained by dividing the difference between the reset voltage $V_{vslp}$ and the fixed reference voltage $V_{refp}$ is sampled as the sample reset voltage Vp.

Figure 11:
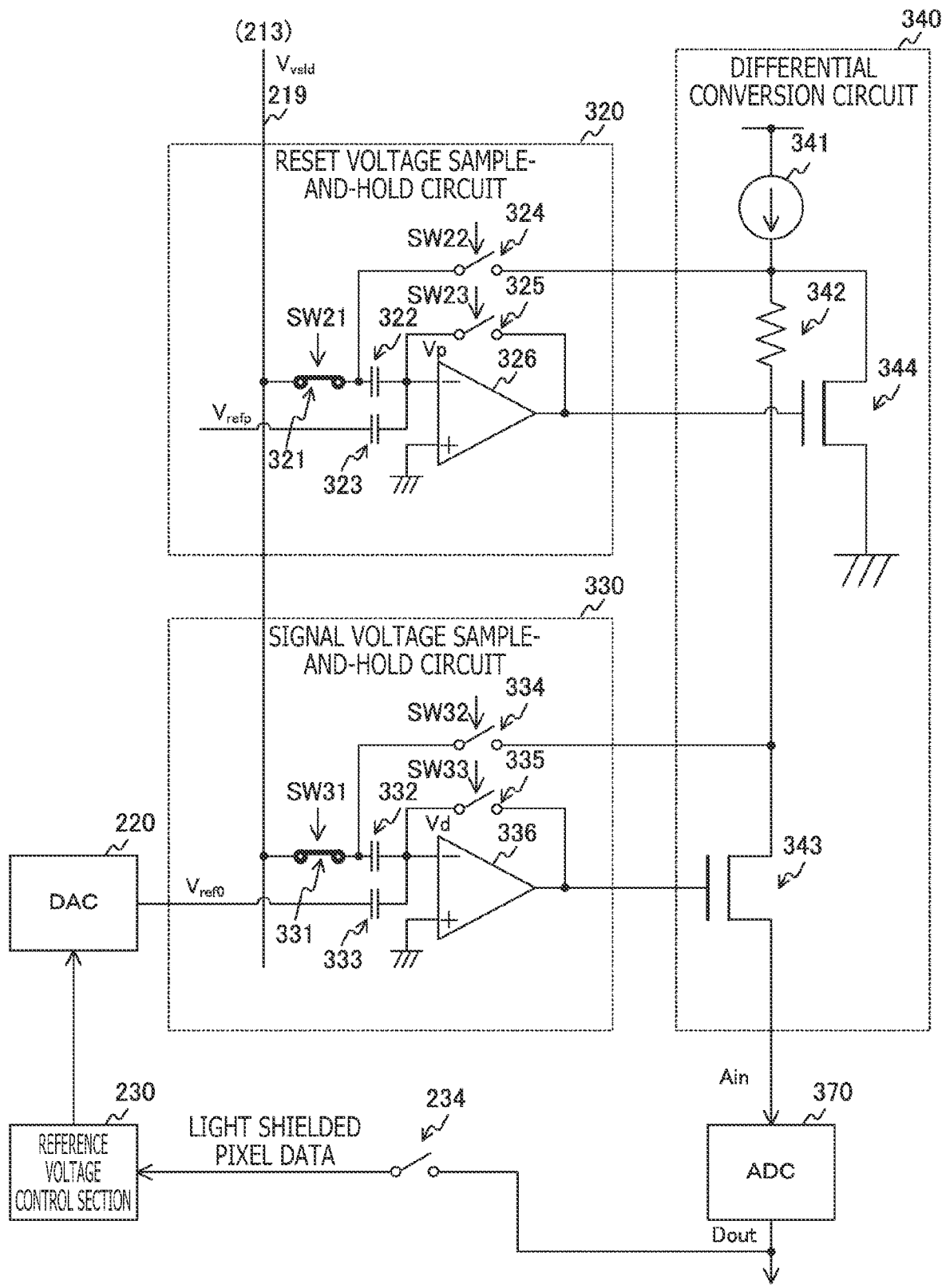
FIG. 11 is a diagram depicting one example of a state of the solid-state imaging element during a signal voltage sampling time according to the first embodiment of the present technology.

FIG. 11 is a diagram depicting one example of a state of the solid-state imaging element 200 during a signal voltage sampling time according to the first embodiment of the present technology. When exposure is finished, the timing control circuit 212 further closes the switch 331. Accordingly, a voltage obtained by dividing the difference between the signal voltage $V_{vsld}$ and the fixed reference voltage $V_{refp}$ is sampled as the sample reset voltage Vp.

Figure 12:
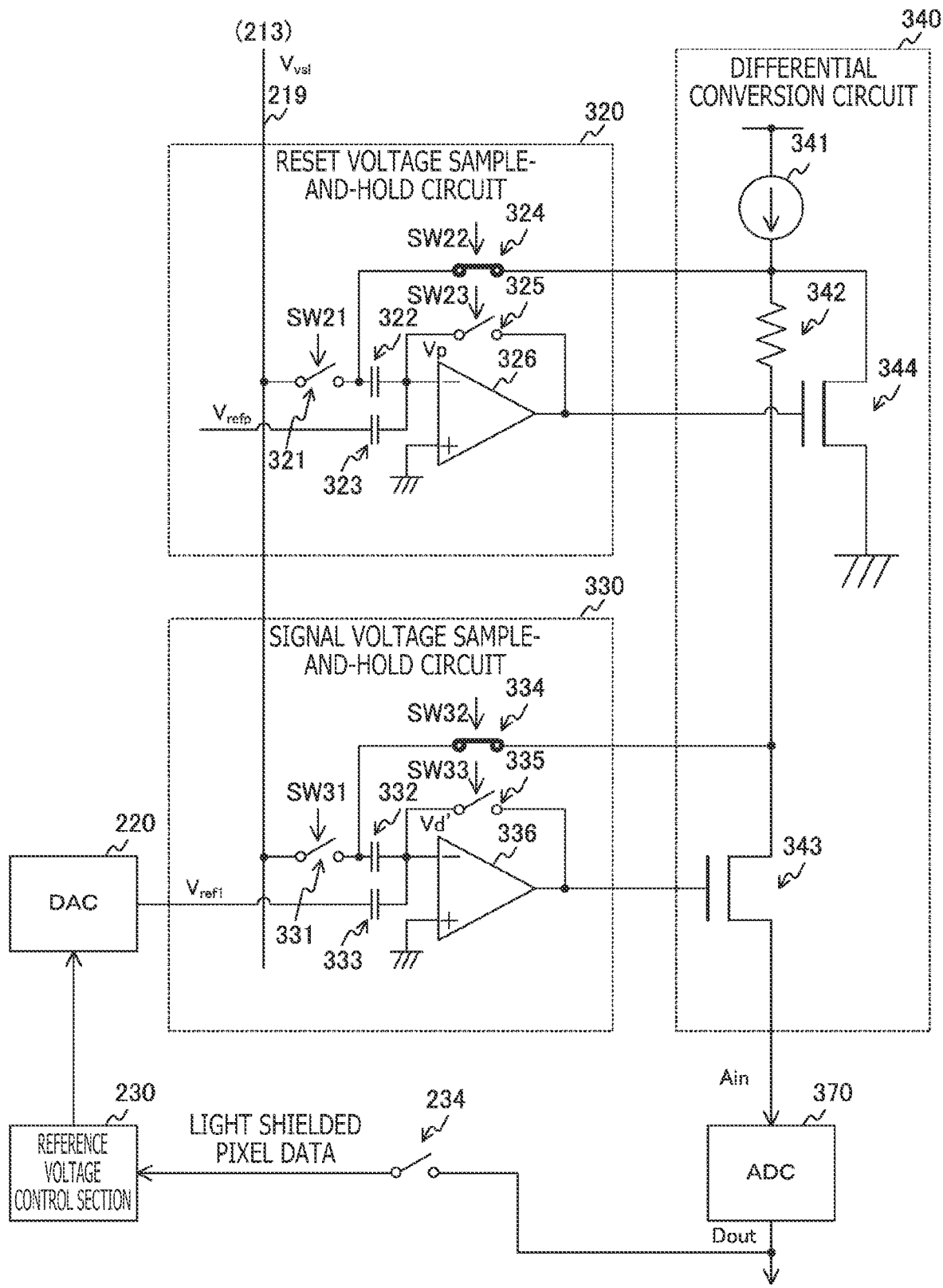
FIG. 12 is a diagram depicting one example of a state of the solid-state imaging element during an AD (Analog-to-Digital) conversion time according to the first embodiment of the present technology.

FIG. 12 is a diagram depicting one example of a state of the solid-state imaging element 200 during an AD conversion time according to the first embodiment of the present technology.

Immediately after an AD period, the reference voltage control section 230 performs control to modulate the value of the variable reference voltage $V_{refd}$ according to the dark current amount. On the other hand, the value of the fixed reference voltage $V_{refp}$ is fixed.

Further, during an AD period, the timing control circuit 212 closes the switches 324 and 334 but opens the remaining switches. Accordingly, the sample reset voltage Vp and the sample signal voltage Vd' are held, and the amplifiers 326 and 336 amplify and output the voltages.

The differential conversion circuit 340 converts the difference between the voltage obtained by amplifying the sample reset voltage Vp and the voltage obtained by amplifying the sample signal voltage Vd' to a current and outputs the current as the current signal Ain to the ADC 370.

Figure 13:
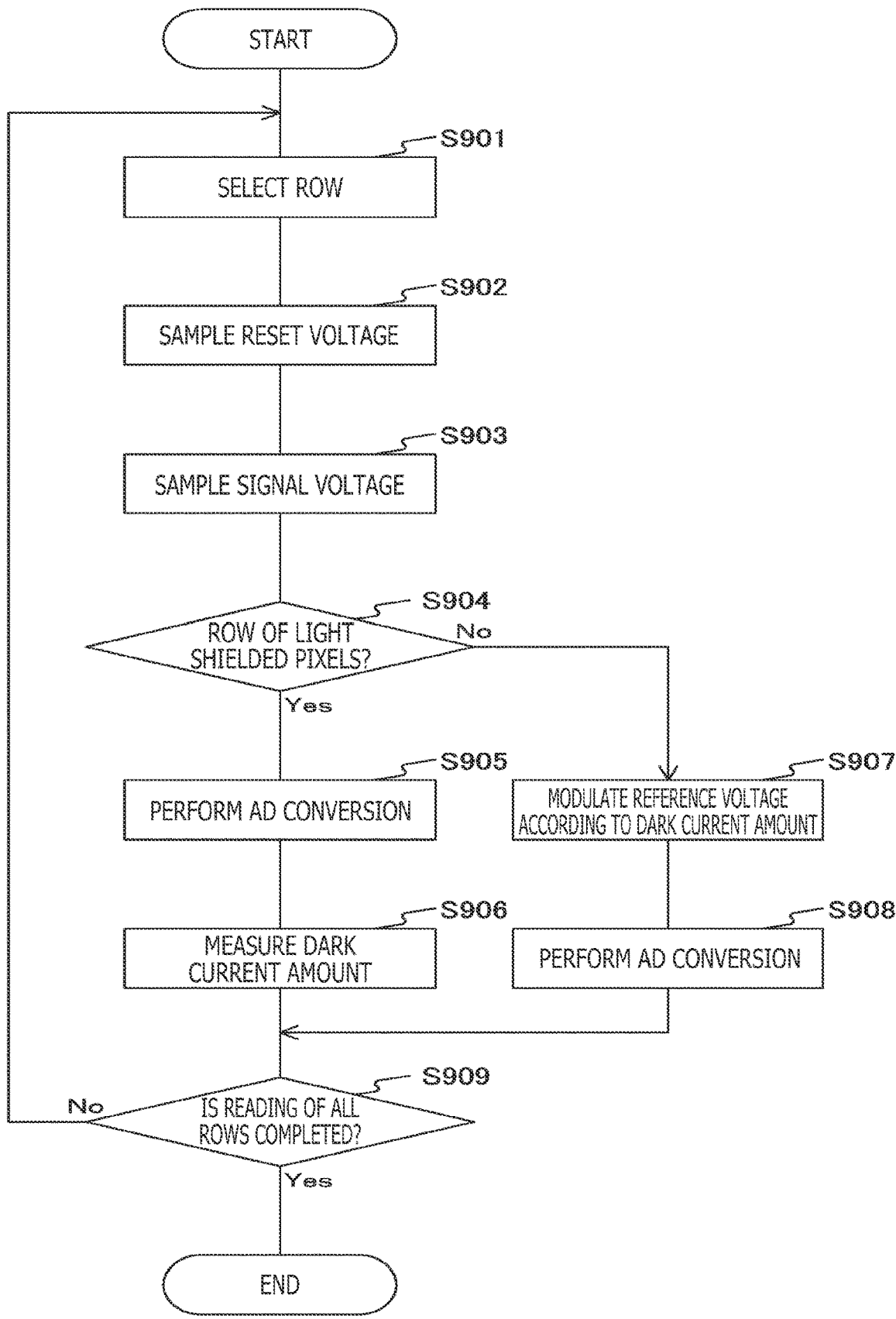
FIG. 13 is a flowchart depicting one example of operation of the solid-state imaging element according to the first embodiment of the present technology.

FIG. 13 is a flowchart depicting one example of operation of the solid-state imaging element 200 according to the first embodiment of the present technology. This operation is started when an application for performing imaging to obtain image data is executed.

In the solid-state imaging element 200, the vertical scanning circuit 211 selects the row to be read out (step S901). The reset voltage sample-and-hold circuit 320 samples a voltage corresponding to a reset voltage (step S902), and the signal voltage sample-and-hold circuit 330 samples a voltage corresponding to a signal voltage (step S903). The solid-state imaging element 200 determines whether or not the to-be-read row is a row of the light shielded pixels 214 (step S904).

In a case where the row is a row of the light shielded pixels 214 (step S904: Yes), the ADC 370 performs AD conversion of a current having undergone CDS processing (step S905), and the reference voltage control section 230 measures a dark current amount (step S906).

In a case where the row is a row of the effective pixels 215 (step S904: No), the reference voltage control section 230 modulates the variable reference voltage according to the dark current amount (step S908), and the ADC 370 performs AD conversion on a current having undergone CDS processing (step S909).

After step S906 or S909, the solid-state imaging element 200 determines whether or not reading of all the rows is completed (step S907). In a case where reading of all the rows is not completed (step S907: No), the solid-state imaging element 200 repeatedly executes step S901 and subsequent steps. On the other hand, in a case where reading of all the rows is completed (step S907: Yes), the solid-state imaging element 200 performs the following steps at the DSP circuit 120, etc. Then, the operation for performing imaging to obtain image data is ended.

It is to be noted that, in a case where a plurality of image data pieces is successively obtained in synchronization with the vertical synchronization signal VSYNC, steps S901 to S907 are repeatedly executed in every cycle of the vertical synchronization signal VSYNC.

According to the first embodiment of the present technology, since the reference voltage control section 230 modulates the variable reference voltage according to the dark current amount in the abovementioned manner, the signal voltage sample-and-hold circuit 330 can sample a sample signal voltage having fluctuated according to the modulated variable reference voltage. Accordingly, the difference between the sample signal voltage and the sample reset voltage is corrected according to the dark current amount so that a current corresponding to the difference is also corrected according to the dark current amount. As a result of this correction of the current, the current is inhibited from falling outside the input range of the ADC, whereby the accuracy of AD conversion of the current can be improved.

2. Second Embodiment

In the first embodiment described above, the circuits and elements of the solid-state imaging element 200 are disposed on a single board (light receiving board 201). However, in such a configuration, the circuit scale of the light receiving board 201 is increased with an increase of the number of pixels. The solid-state imaging element 200 of a second embodiment is different from that of the first embodiment in that the circuits and the like are disposed on two layered boards in a distributed manner.

Figure 14:
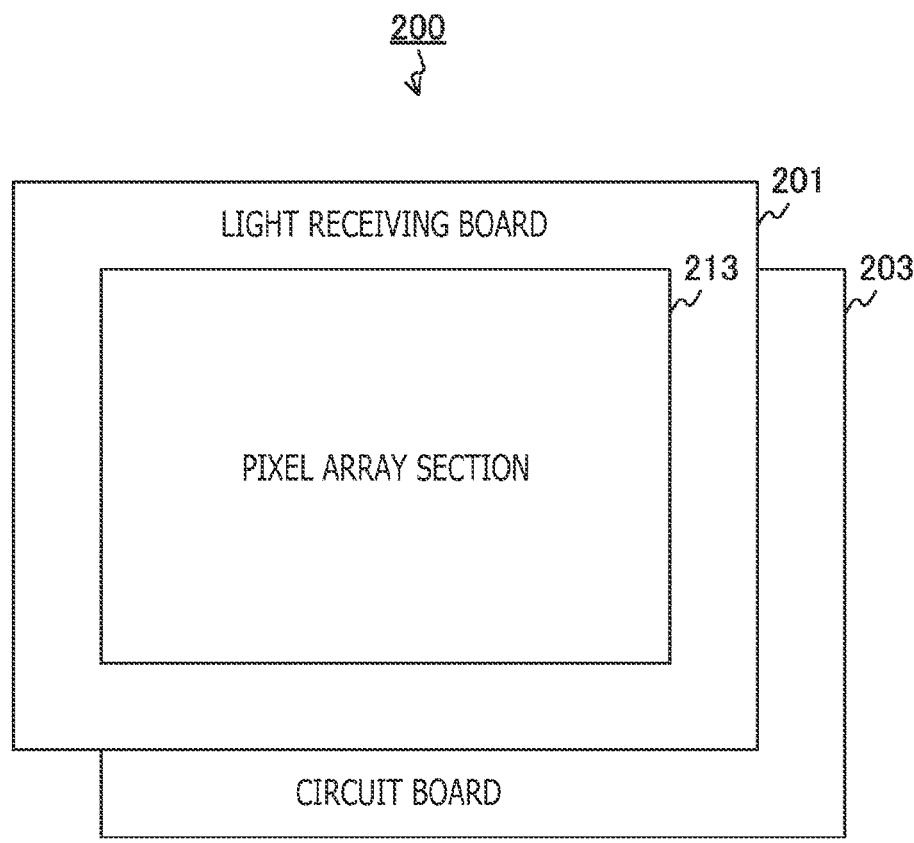
FIG. 14 is a diagram depicting one example of a layered structure of a solid-state imaging element according to a second embodiment of the present technology.

FIG. 14 is a diagram depicting one example of a layered structure of the solid-state imaging element 200 according to the second embodiment of the present technology. The solid-state imaging element 200 according to the second embodiment includes a circuit board 203 in place of the support board 202. The circuit board 203 is layered on the light receiving board 201, and only the pixel array section 213 is disposed on the light receiving board 201.

Figure 15:
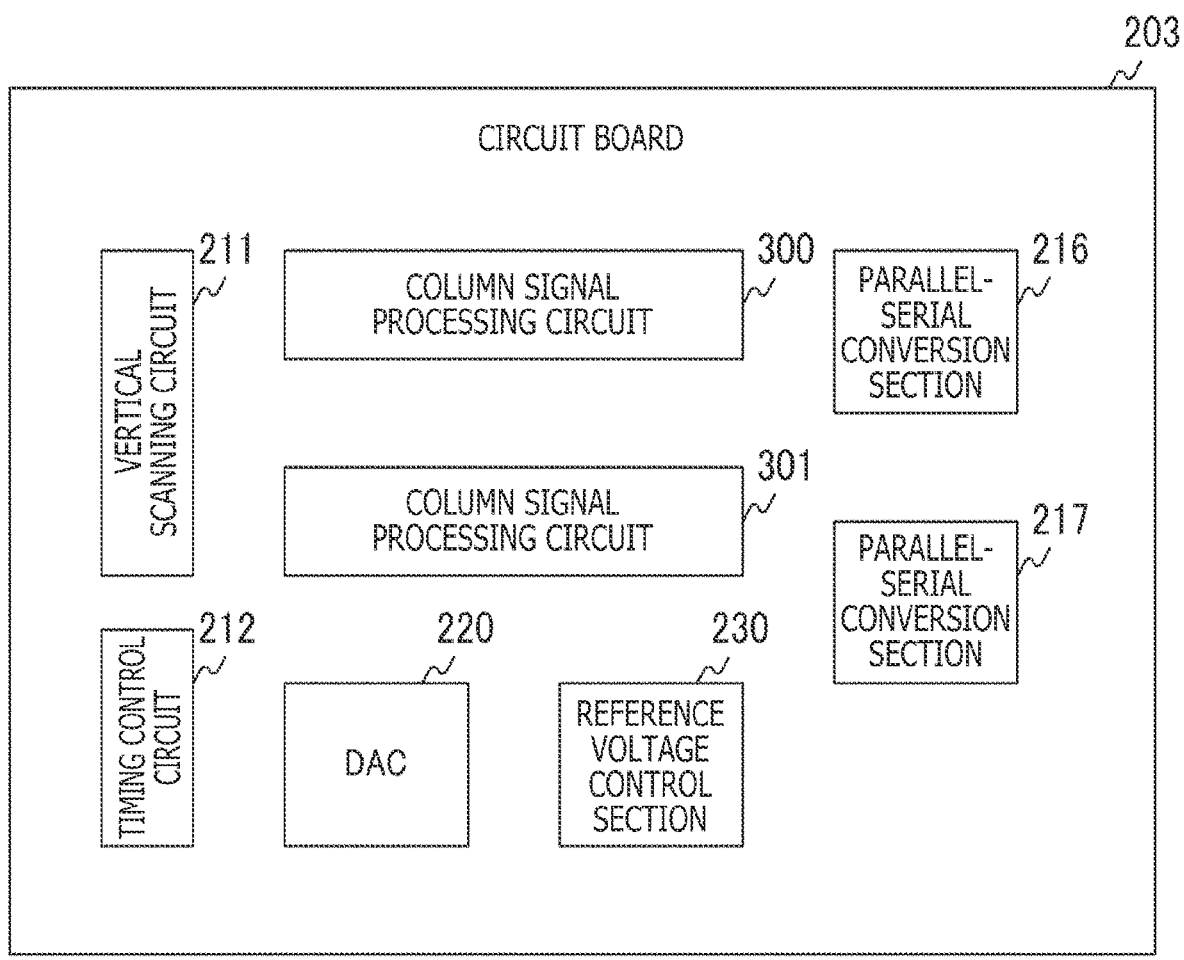
FIG. 15 is a diagram depicting one example of circuits disposed on a circuit board according to the second embodiment of the present technology.

FIG. 15 is a diagram depicting one example of circuits disposed on the circuit board 203 according to the second embodiment of the present technology. The vertical scanning circuit 211, the timing control circuit 212, the DAC 220, and the reference voltage control section 230 are disposed on the circuit board 203 according to the second embodiment. In addition, the column signal processing circuits 300 and 301 and the parallel-serial conversion sections 216 and 217 are disposed on the circuit board 203.

According to the second embodiment of the present technology, the circuits, etc., are disposed on the light receiving board 201 and the circuit board 203 that are layered on each other in a distributed manner, as explained above. Therefore, the circuit scale per board can be reduced.

[Modification]

In the second embodiment described above, the circuits and the elements in the solid-state imaging element 200 are disposed on two boards (the light receiving board 201 and the circuit board 203). However, in such a configuration, the circuit scale per board increases with an increase of the number of pixels. The solid-state imaging element 200 according to a modification of the second embodiment is different from that of the first embodiment in that the circuits and the like are disposed on three layered boards in a distributed manner.

Figure 16:
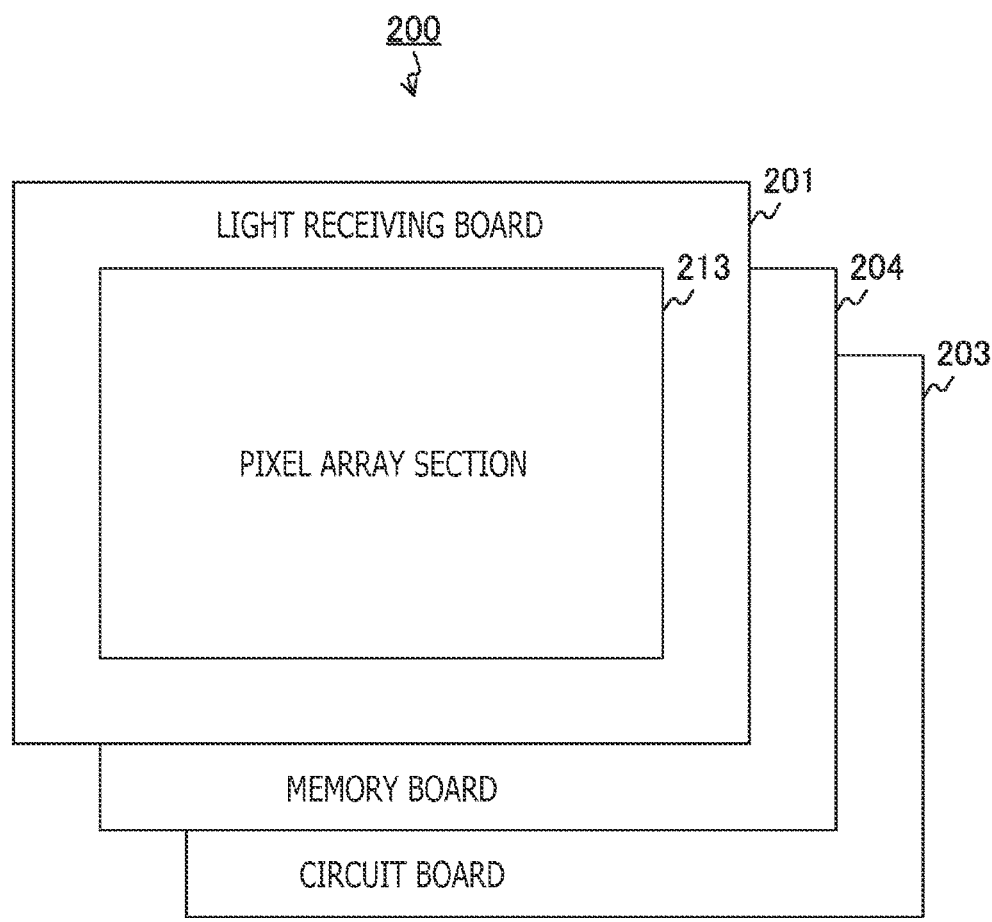
FIG. 16 is a diagram depicting one example of a layered structure of a solid-state imaging element according to a modification of the second embodiment of the present technology.

FIG. 16 is a diagram depicting one example of a layered structure of the solid-state imaging element 200 according to the modification of the second embodiment of the present technology. The solid-state imaging element 200 according to the modification of the second embodiment further includes a memory board 204. The light receiving board 201 is the uppermost layer. The light receiving board 201, the memory board 204, and the circuit board 203 are layered in this order from the top.

A memory such as a DRAM (Dynamic Random Access Memory) for holding image data is disposed on the memory board 204.

Figure 17:
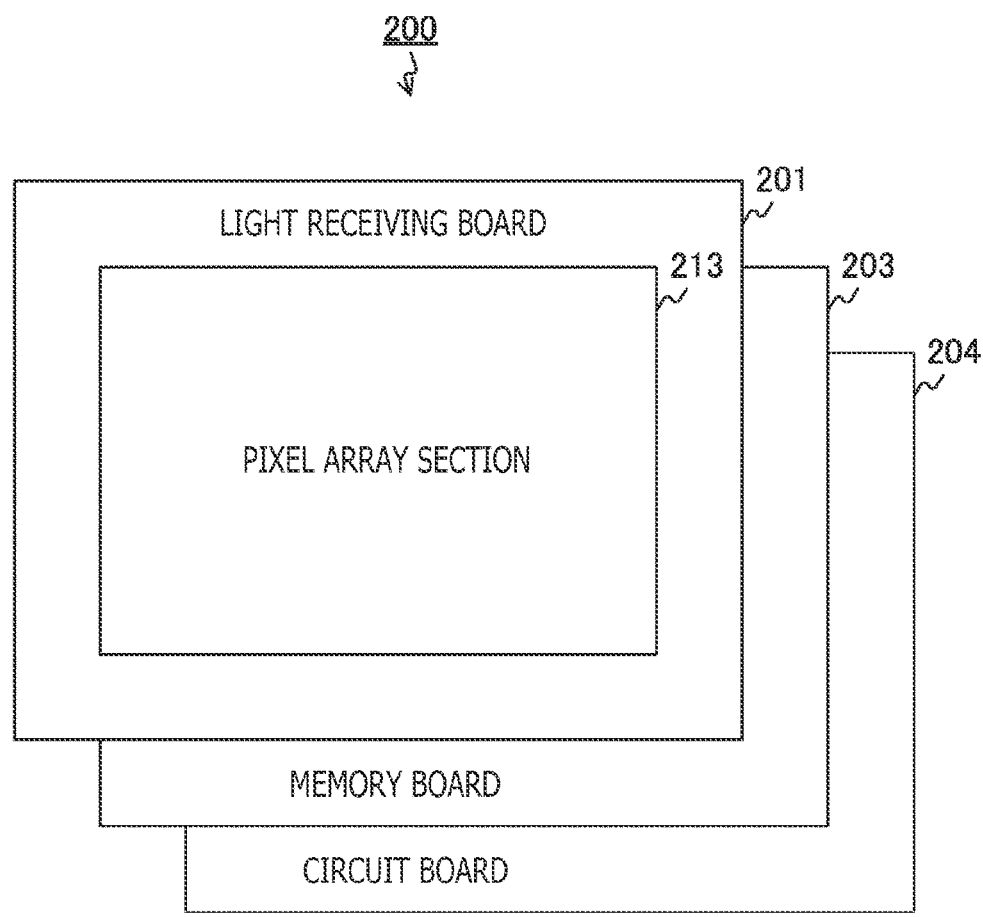
FIG. 17 is a diagram depicting one example of a layered structure in an imaging device obtained by changing a layered order according to the modification of the second embodiment of the present technology.

It is to be noted that the light receiving board 201, the circuit board 203, and the memory board 204 may be layered in this order from the top, as illustrated in FIG. 17.

Thus, according to the modification of the second embodiment of the present technology, the circuit and the like are disposed on the light receiving board 201, the memory board 204, and the circuit board 203 that are layered in a distributed manner. Therefore, the circuit scale per board can be reduced.

3. Third Embodiment

In the first embodiment described above, the reset voltage sample-and-hold circuit 320 and the signal voltage sample-and-hold circuit 330 are disposed for each column. However, in such a configuration, AD conversion cannot be performed in parallel with sampling. A solid-state imaging element according to a third embodiment is different from that of the first embodiment in that two reset voltage sample-and-hold circuits and two signal voltage sample-and-hold circuits are disposed for each column so that sampling and AD conversion are performed in parallel.

Figure 18:
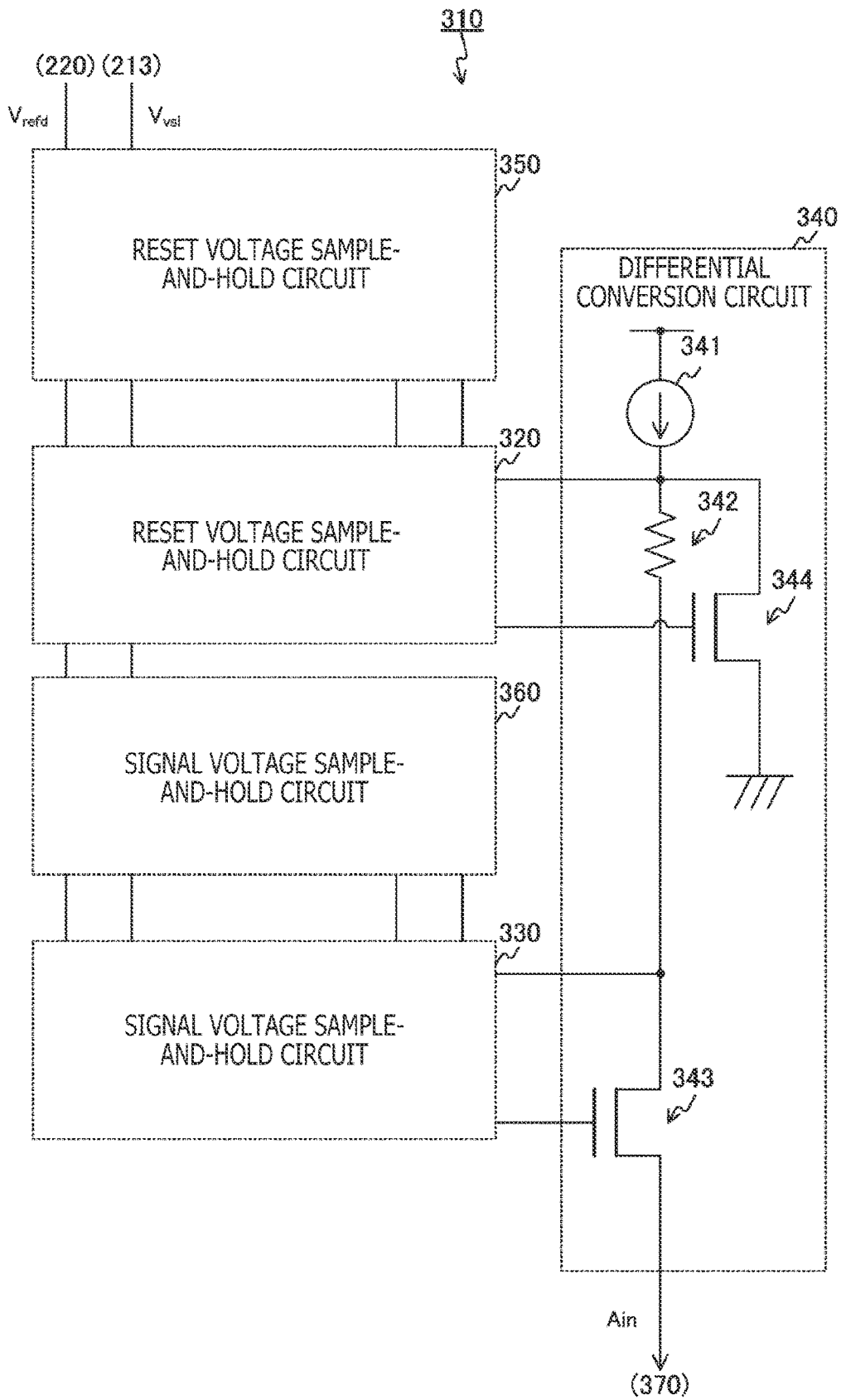
FIG. 18 is a circuit diagram depicting one configuration example of a sample-and-hold block according to a third embodiment of the present technology.

FIG. 18 is a circuit diagram depicting one configuration example of the sample-and-hold block 310 according to the third embodiment of the present technology. The sample-and-hold block 310 according to the third embodiment is different from that of the first embodiment in that a reset voltage sample-and-hold circuit 350 and a signal voltage sample-and-hold circuit 360 are further disposed.

Figure 19:
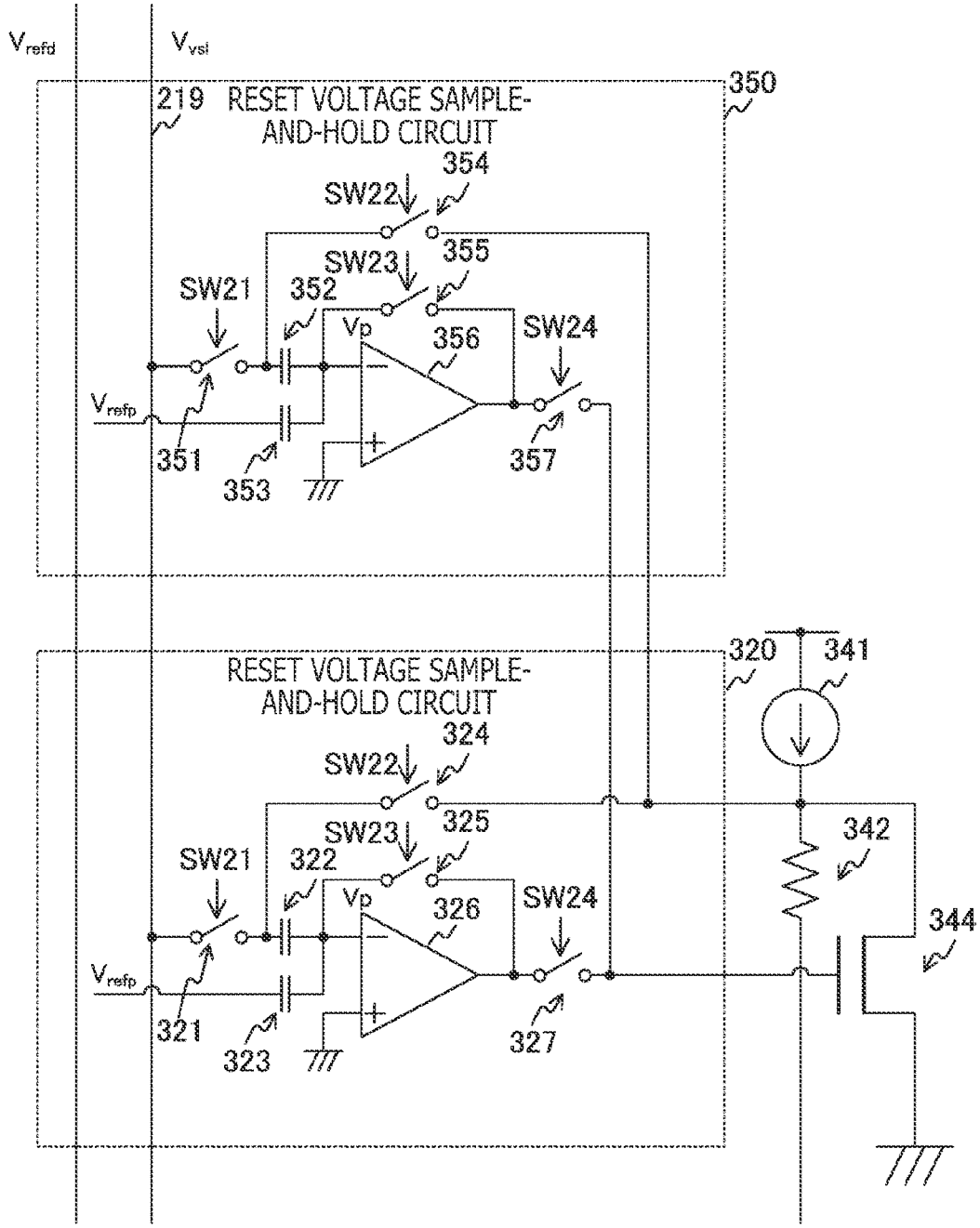
FIG. 19 is a circuit diagram depicting one configuration example of a reset voltage sample-and-hold circuit according to the third embodiment of the present technology.

FIG. 19 is a circuit diagram depicting one configuration example of the reset voltage sample-and-hold circuits 320 and 350 according to the third embodiment of the present technology.

The reset voltage sample-and-hold circuit 320 according to the third embodiment further includes a switch 327. The switch 327 is configured to switch a path between a gate of the N-type transistor 344 and an output terminal of the amplifier 326 and the switch 325, according to a control signal SW24 from the timing control circuit 212.

The reset voltage sample-and-hold circuit 350 includes switches 351, 354, 355, and 357, capacitors 352 and 353, and an amplifier 356. The connection configuration of these elements is similar to that in the reset voltage sample-and-hold circuit 320.

While the reset voltage sample-and-hold circuit 320 performs sampling, the timing control circuit 212 opens the switch 327 and closes the switch 357. On the other hand, while the reset voltage sample-and-hold circuit 320 performs holding, the timing control circuit 212 closes the switch 327 but opens the switch 357.

Figure 20:
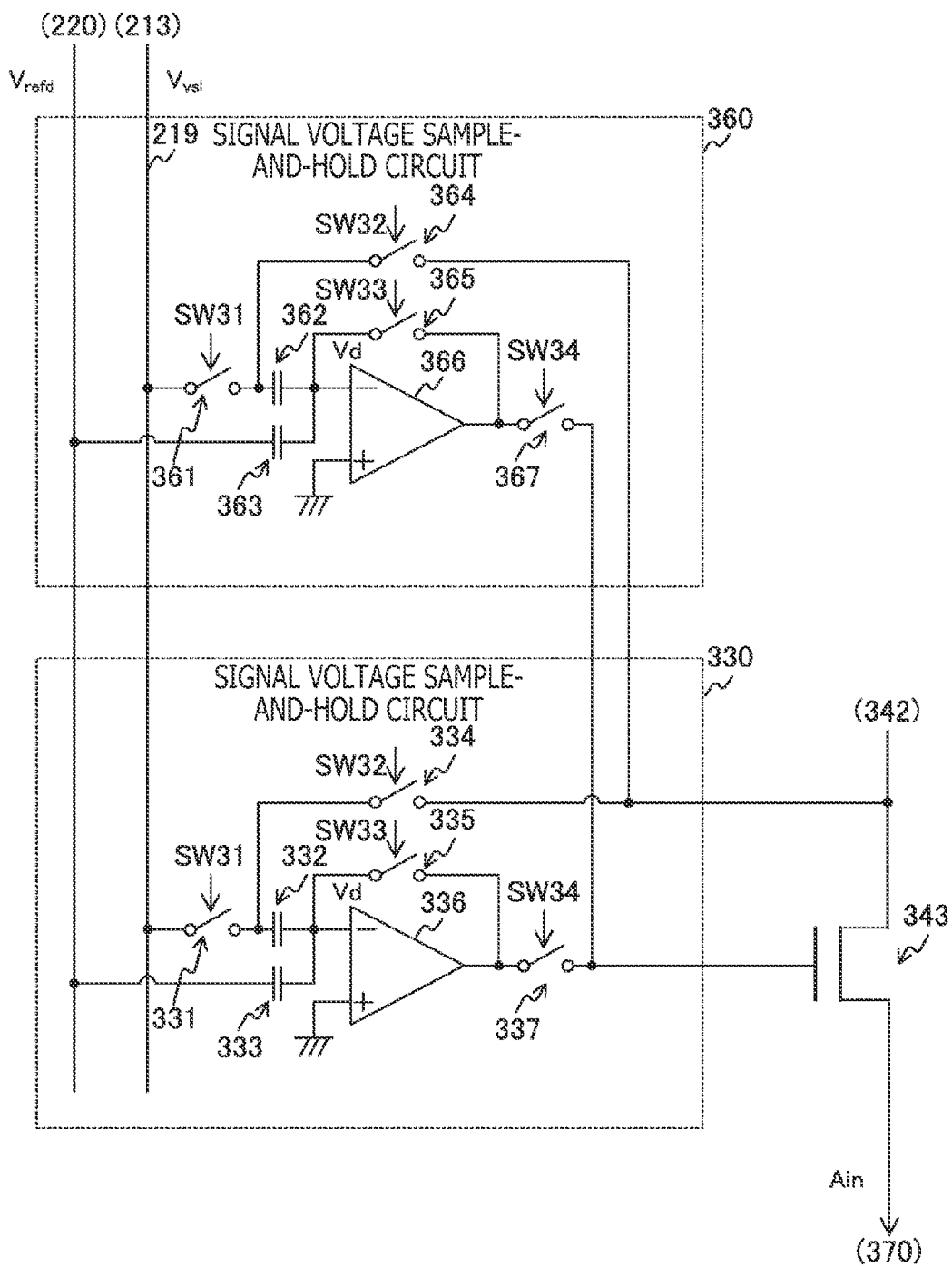
FIG. 20 is a circuit diagram depicting one configuration example of a signal voltage sample-and-hold circuit according to the third embodiment of the present technology.

FIG. 20 is a circuit diagram depicting one configuration example of the signal voltage sample-and-hold circuits 330 and 360 according to the third embodiment of the present technology.

The signal voltage sample-and-hold circuit 330 according to the third embodiment further includes a switch 337. The switch 337 is configured to switch a path between a gate of the N-type transistor 343 and an output terminal of the amplifier 336 and the switch 335, according to a control signal SW34 from the timing control circuit 212.

The signal voltage sample-and-hold circuit 360 includes the switches 361, 364, 365, and 367, capacitors 362 and 363, and an amplifier 366. The connection configuration of these elements is similar to that in the signal voltage sample-and-hold circuit 330.

While the signal voltage sample-and-hold circuit 330 performs sampling, the timing control circuit 212 opens the switch 337 and closes the switch 367. On the other hand, while the signal voltage sample-and-hold circuit 330 performs holding, the timing control circuit 212 closes the switch 337 and opens the switch 367.

Figure 21:
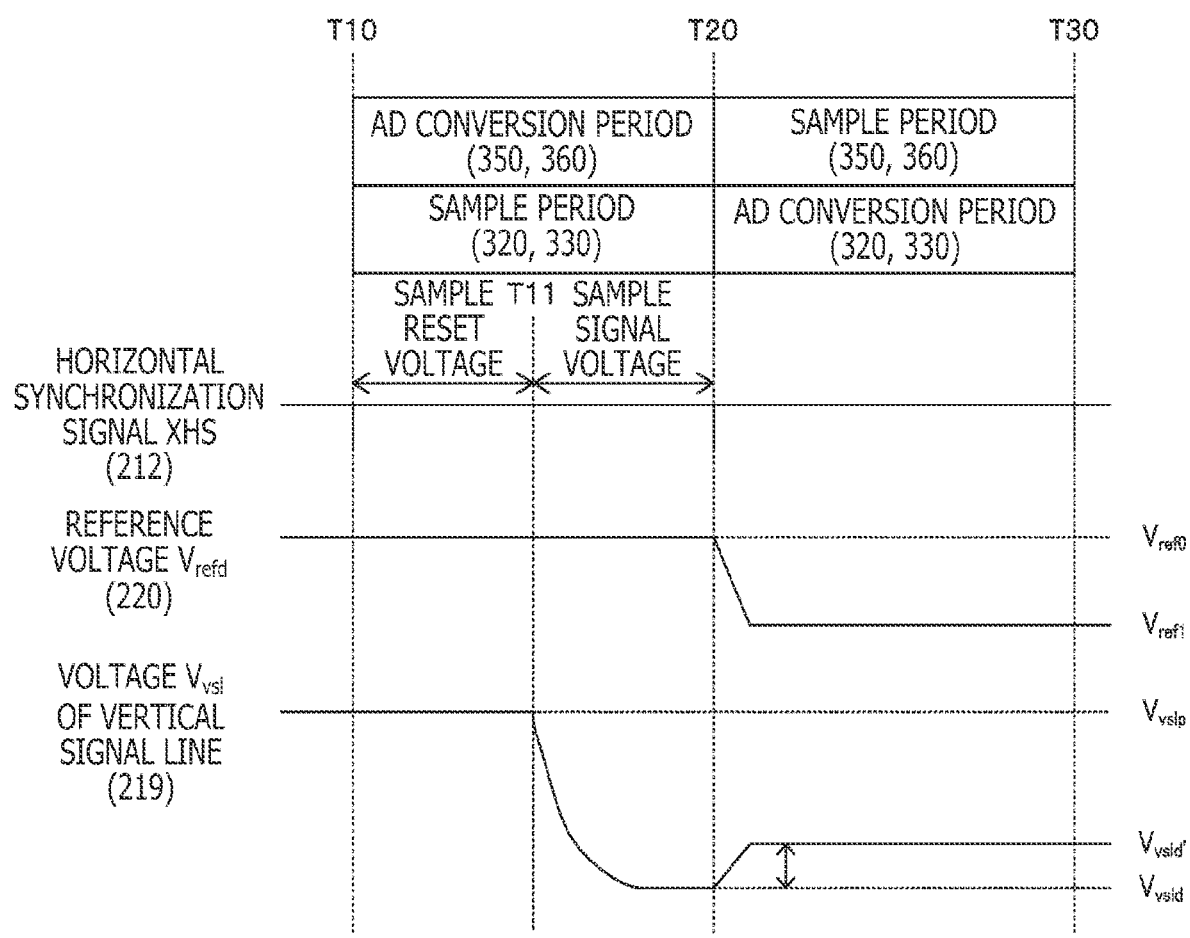
FIG. 21 is a timing chart depicting one example of operation of a solid-state imaging element according to the third embodiment of the present technology.

FIG. 21 is a timing chart depicting one example of operation of the solid-state imaging element 200 according to the third embodiment of the present technology. In a period from timing T10 to T20 corresponding to the cycle of a horizontal synchronization signal XHS, the reset voltage sample-and-hold circuit 320 and the signal voltage sample-and-hold circuit 330 sample voltages corresponding to a reset voltage and a signal voltage, respectively, in order. On the other hand, the reset voltage sample-and-hold circuit 350 and the signal voltage sample-and-hold circuit 360 hold the sampled voltages, and AD conversion is performed on a current corresponding to the difference between the voltages.

Then, in a period from timing T20 to T30 corresponding to the next cycle of the horizontal synchronization signal XHS, the reset voltage sample-and-hold circuit 350 and the signal voltage sample-and-hold circuit 360 sample voltages corresponding to a reset voltage and a signal voltage, respectively, in order. On the other hand, the reset voltage sample-and-hold circuit 320 and the signal voltage sample-and-hold circuit 330 hold the sampled voltages, and AD conversion is performed on a current corresponding to the difference between the voltages.

In the abovementioned manner, sampling and AD conversion are performed in parallel within a cycle of a horizontal synchronization signal XHS.

Figure 22:
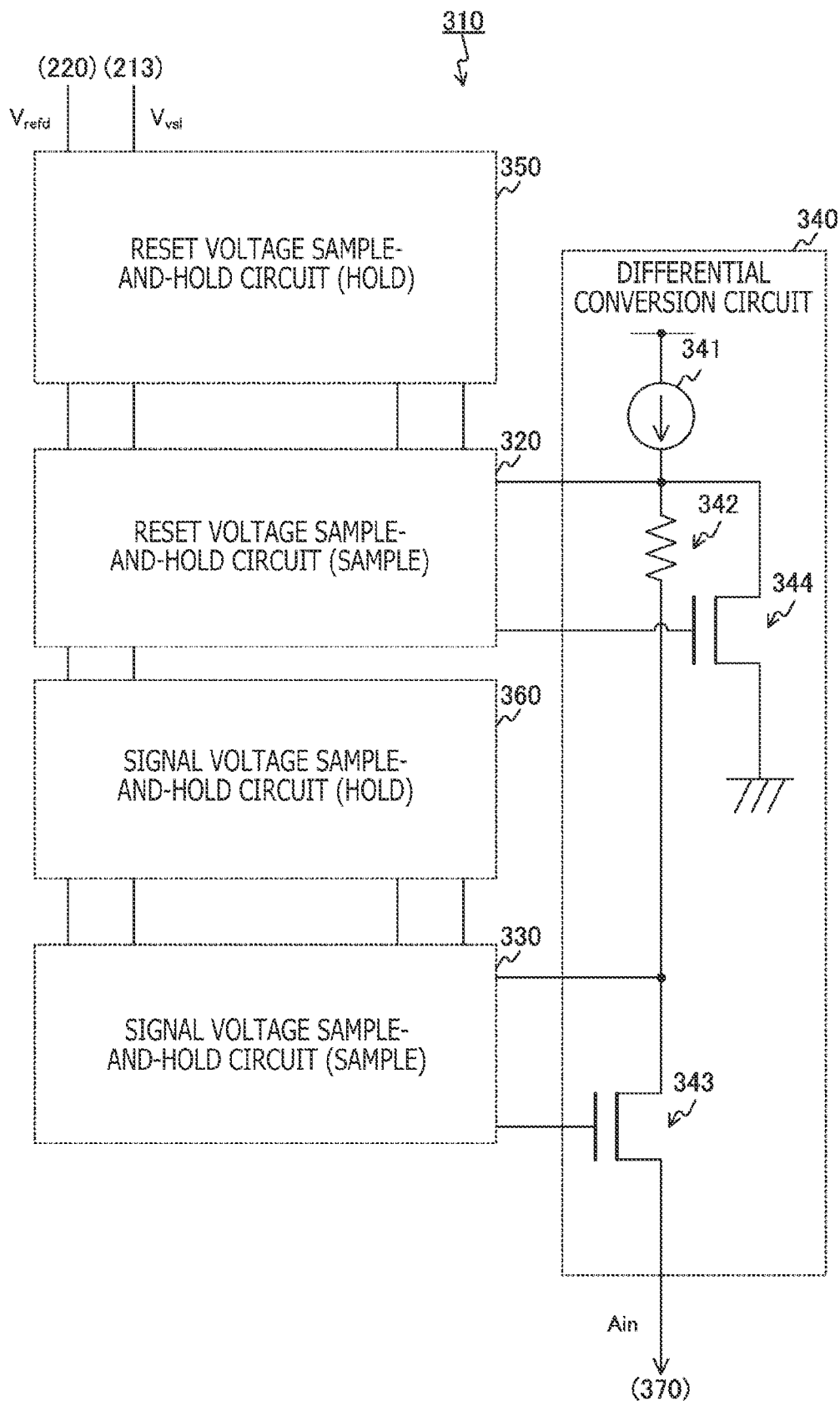
FIG. 22 is a diagram depicting one example of a state of the solid-state imaging element during an odd-number row reading time according to the third embodiment of the present technology.

FIG. 22 is a diagram depicting one example of a state of the solid-state imaging element during an odd-number row reading time according to the third embodiment of the present technology. During an odd-number row reading time, the reset voltage sample-and-hold circuit 320 and the signal voltage sample-and-hold circuit 330 sample voltages corresponding to a reset voltage and a signal voltage, respectively, in order, for example. On the other hand, the reset voltage sample-and-hold circuit 350 and the signal voltage sample-and-hold circuit 360 hold the sampled voltages, and AD conversion is performed on a current corresponding to the difference between the voltages.

Figure 23:
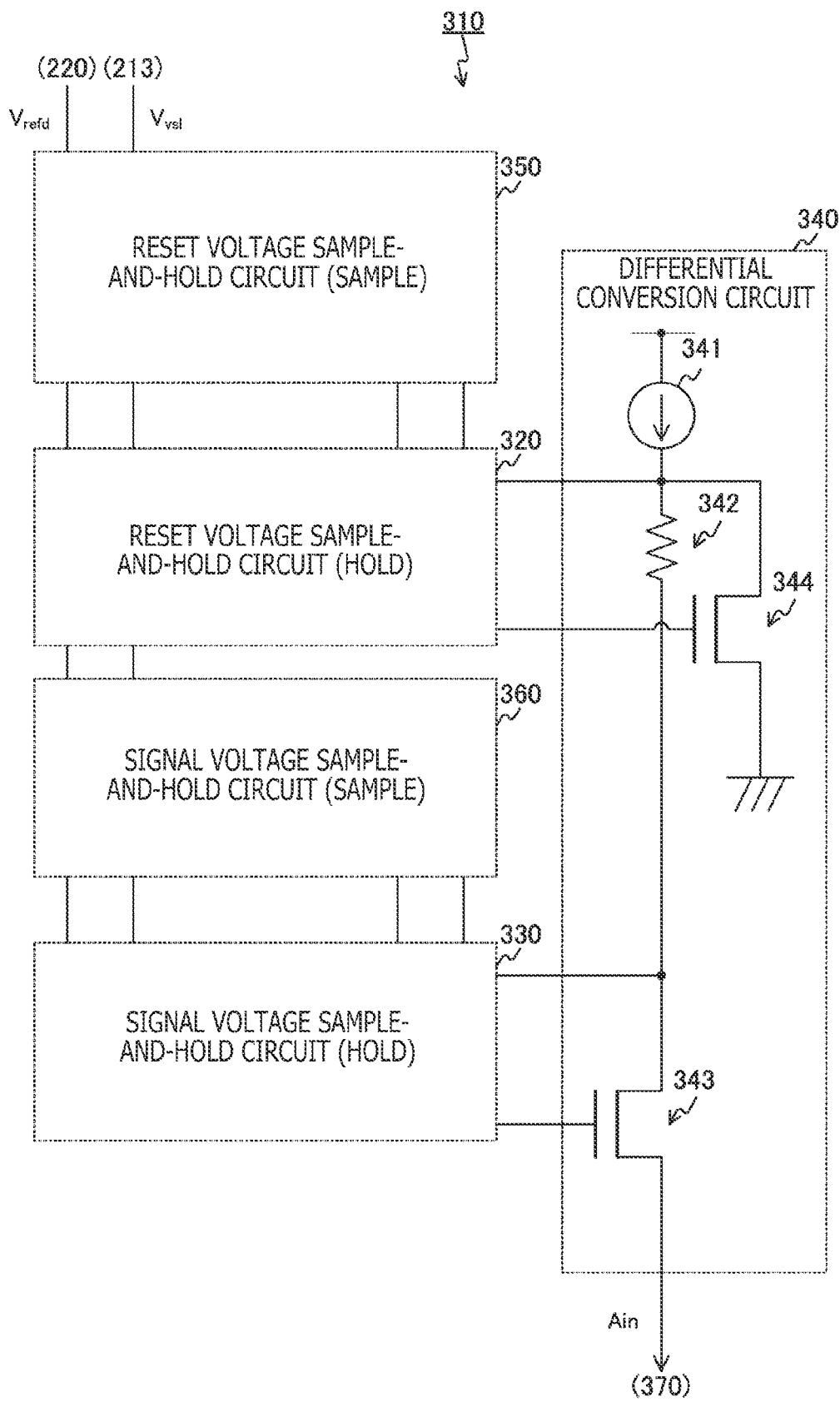
FIG. 23 is a diagram depicting one example of a state of the solid-state imaging element during an even-number row reading time according to the third embodiment of the present technology.

FIG. 23 is a diagram depicting one example of a state of the solid-state imaging element during an even-number row reading time according to the third embodiment of the present technology. During an even-number row reading time, the reset voltage sample-and-hold circuit 350 and the signal voltage sample-and-hold circuit 360 sample voltages corresponding to a reset voltage and a signal voltage, respectively, in order, for example. On the other hand, the reset voltage sample-and-hold circuit 320 and the signal voltage sample-and-hold circuit 330 hold the sampled voltages, and AD conversion is performed on a current corresponding to the difference between the voltages.

It is to be noted that, in the third embodiment, the circuits and the like may be disposed on a plurality of boards in a distributed manner, as in the second embodiment.

According to the third embodiment of the present technology, one of the reset voltage sample-and-hold circuits 320 and 350 can perform sampling while the other performs holding in the abovementioned manner. The same applies to a pair of the signal voltage sample-and-hold circuits 330 and 360. Accordingly, the reading speed can be made twice as high as that in the first embodiment.

4. Application to Mobile Body

The technology according to the present disclosure (the present technology) is applicable to various products. For example, the technology according to the present disclosure may be realized by an apparatus which is mounted on any one of mobile bodies such as a vehicle, an electric vehicle, a hybrid electric vehicle, a motorcycle, a bicycle, a personal mobility, an aircraft, a drone, a ship, and a robot.

FIG. 24 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 24, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 24, an audio speaker 12061, a display section 12062, and an instrument panel 12063 are illustrated as the output device. The display section 12062 may, for example, include at least one of an on-board display and a head-up display.

Figure 25:
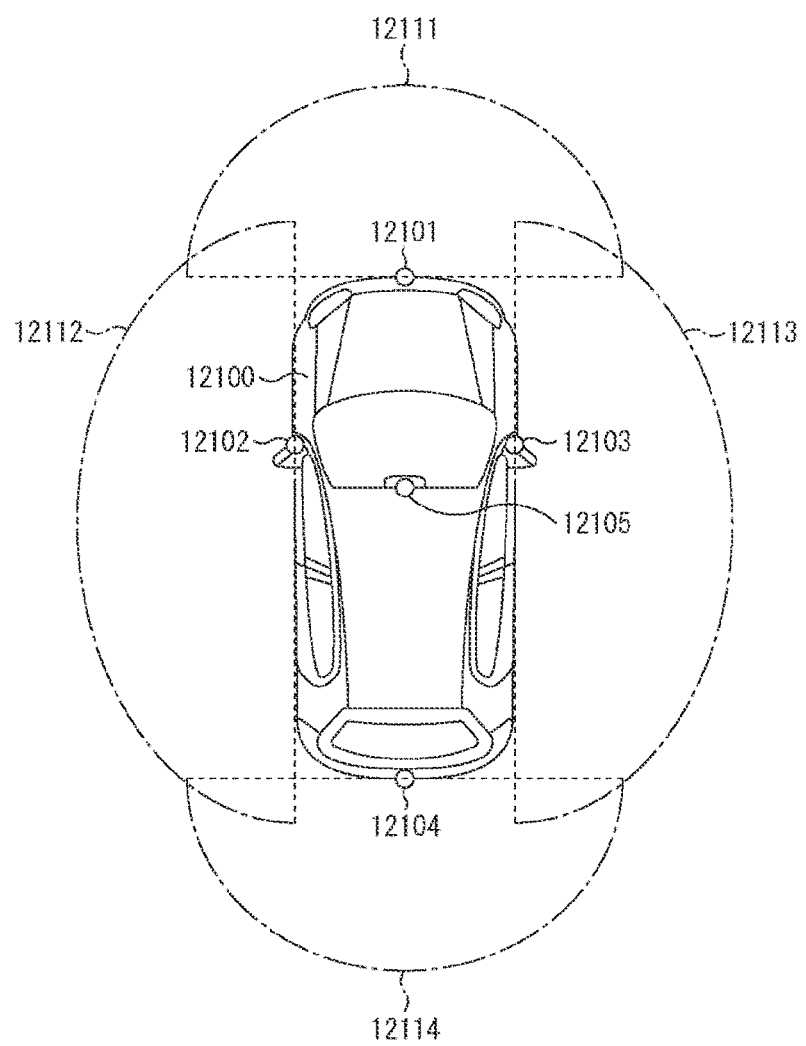
FIG. 25 is a diagram of assistance in explaining an example of installation positions of an outside-vehicle information detecting section and an imaging section.

FIG. 25 is a diagram depicting an example of the installation position of the imaging section 12031.

In FIG. 25, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 25 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure can be applied has been explained above. The technology according to the present disclosure can be applied to the imaging section 12031 among the abovementioned configurations. Specifically, the imaging device 100 in FIG. 1 can be applied to the imaging section 12031. When the technology according to the present disclosure is applied to the imaging section 12031, the AD conversion accuracy can be improved to obtain a photographed image that is more easily to see. Accordingly, fatigue of a driver can be lessened.

It is to be noted that each of the embodiments described above exemplifies one example for realizing the present technology. The features in the embodiments have correspondence with the respective invention-specifying matters in the claims. Similarly, the invention-specifying matters in the claims have correspondence with matters having the same names in the embodiments of the present technology. However, the present technology is not limited to the embodiments, and various modifications of the embodiments can be made within the gist of the present technology such that the present technology can be realized.

It is to be noted that the effects disclosed herein are just examples, and thus, are not limitative. In addition, any other effects may be provided.

It is to be noted that the present technology may also have the following configurations.

(1)

A solid-state imaging element including:

a signal voltage sample-and-hold circuit that samples and holds, as a sample signal voltage, a voltage obtained by dividing a difference between a voltage of a vertical signal line corresponding to a light reception amount in a pixel and a predetermined variable reference voltage;

an analog-to-digital converter that converts an analog signal corresponding to the sample signal voltage to a digital signal; and a reference voltage control section that performs control to modulate a value of the variable reference voltage according to a dark current amount in the pixel.

(2)

The solid-state imaging element according to (1), in which the pixel includes either an effective pixel which is not shielded from light or a light shielded pixel which is shielded from light, and the reference voltage control section measures the dark current amount from the digital signal corresponding to the light shielded pixel.

(3)

The solid-state imaging element according to (1) or (2), further including:

a reset voltage sample-and-hold circuit that samples and holds, as a sample reset voltage, a voltage obtained by dividing a difference between a voltage of the vertical signal line when the pixel is initialized and a predetermined fixed reference voltage; and a differential conversion circuit that converts a difference between the sample signal voltage and the sample reset voltage to a current signal and supplies the current signal as the analog signal to the analog-to-digital converter.

(4)

The solid-state imaging element according to (3), in which the pixels are arranged into a two-dimensional lattice-like shape in a pixel array section, a pair of the signal voltage sample-and-hold circuits and a pair of the reset voltage sample-and-hold circuits are disposed for each of columns that include the pixels and that are arranged in a predetermined direction in the pixel array section, during a sample period in one signal voltage sample-and-hold circuit of the pair, the other signal voltage sample-and-hold circuit holds the sample signal voltage, and, during a sample period in one reset voltage sample-and-hold circuit of the pair, the other reset voltage sample-and-hold circuit holds the sample reset voltage.

(5)

The solid-state imaging element according to any one of (1) to (4), in which the pixels are arranged on a predetermined light receiving board, and the signal voltage sample-and-hold circuit, the analog-to-digital converter, and the reference voltage control section are disposed on a predetermined circuit board that is layered on the light receiving board.

(6)

The solid-state imaging element according to (5), further including:

a memory that holds the digital signal, in which the memory is disposed on a predetermined memory board.

(7)

The solid-state imaging element according to any one of (1) to (6), further including:

a reference voltage generating section that generates the variable reference voltage, under control of the reference voltage control section, and supplies the variable reference voltage to the signal voltage sample-and-hold circuit.

(8)

An imaging device including:

a signal voltage sample-and-hold circuit that samples and holds, as a sample signal voltage, a voltage obtained by dividing a difference between a voltage of a vertical signal line corresponding to a light reception amount in a pixel and a predetermined variable reference voltage;

an analog-to-digital converter that converts an analog signal corresponding to the sample signal voltage to a digital signal;

a reference voltage control section that performs control to modulate a value of the variable reference voltage according to a dark current amount in the pixel; and a digital signal processing circuit that processes the digital signal.

(9) A method for controlling a solid-state imaging element, the method including:

a signal voltage sampling-and-holding procedure of sampling and holding, as a sample signal voltage, a voltage obtained by dividing a difference between a voltage of a vertical signal line corresponding to a light reception amount in a pixel and a predetermined variable reference voltage;

an analog-to-digital converting procedure of converting an analog signal corresponding to the sample signal voltage to a digital signal; and a reference voltage controlling procedure of performing control to modulate a value of the variable reference voltage according to a dark current amount in the pixel.

REFERENCE SIGNS LIST

100 Imaging device
110 Optical section
120 DSP circuit
130 Display section
140 Operation section
150 Bus
160 Frame memory
170 Storage section
180 Power source section
200 Solid-state imaging element
201 Light receiving board
202 Support board
203 Circuit board
204 Memory board
211 Vertical scanning circuit
212 Timing control circuit
213 Pixel array section
214 Light shielded pixel
215 Effective pixel
216, 217 Parallel-serial conversion section
220 DAC
221, 326, 336, 356, 366 Amplifier
222, 225 P-type transistor
223, 343, 344 N-type transistor
224, 227, 342 Resistor
226, 232, 234, 321, 324, 325, 327, 331, 334, 335, 337, 351, 354, 355, 357, 361, 364, 365, 367 Switch
230 Reference voltage control section
231 Voltage value selecting section
233 Dark current measuring section
300, 301 Column signal processing circuit
310 Sample-and-hold block
320, 350 Reset voltage sample-and-hold circuit
322, 323, 332, 333, 352, 353, 362, 363 Capacitor
330, 360 Signal voltage sample-and-hold circuit
340 Differential conversion circuit
341 Current source
370 ADC
380 Data register
390 Horizontal scanning circuit

The invention claimed is:

1. A solid-state imaging element, comprising:
a signal voltage sample-and-hold circuit configured to sample and hold, as a sample signal voltage, a voltage obtained by division of a difference between a first voltage of a vertical signal line corresponding to a light reception amount in a pixel and a determined variable reference voltage;
a reference voltage control section configured to perform control to modulate a value of the determined variable reference voltage according to a dark current amount in the pixel;
a reset voltage sample-and-hold circuit configured to sample and hold, as a sample reset voltage, a voltage obtained by division of a difference between a second voltage of the vertical signal line when the pixel is initialized and a determined fixed reference voltage;
a differential conversion circuit configured to:
convert a difference between the sample signal voltage and the sample reset voltage to a current signal; and
supply the current signal as an analog signal; and
an analog-to-digital converter configured to convert the analog signal to a digital signal.

2. The solid-state imaging element according to claim 1, wherein
the pixel includes one of an effective pixel which is not shielded from light or a light shielded pixel which is shielded from the light, and
the reference voltage control section is further configured to measure the dark current amount from the digital signal corresponding to the light shielded pixel.

3. The solid-state imaging element according to claim 1, further comprising:
a pixel array section including a plurality of pixels, wherein the plurality of pixels includes the pixel and is in a two-dimensional lattice-like shape; and
a pair of signal voltage sample-and-hold circuits and a pair of reset voltage sample-and-hold circuits that are disposed for each of columns that include the plurality of pixels and that are arranged in a determined direction in the pixel array section, wherein
during a sample period in a first signal voltage sample-and-hold circuit of the pair of signal voltage sample-and-hold circuits, a second signal voltage sample-and-hold circuit of the pair of signal voltage sample-and-hold circuits holds the sample signal voltage, and
during a sample period in a first reset voltage sample-and-hold circuit of the pair of reset voltage sample-and-hold circuits, a second reset voltage sample-and-hold circuit of the pair of reset voltage sample-and-hold circuits holds the sample reset voltage.

4. The solid-state imaging element according to claim 1, wherein
the pixel is on a light receiving board, and
the signal voltage sample-and-hold circuit, the analog-to-digital converter, and the reference voltage control section are on a circuit board that is layered on the light receiving board.

5. The solid-state imaging element according to claim 4, further comprising a memory configured to hold the digital signal, wherein the memory is on a memory board.

6. The solid-state imaging element according to claim 1, further comprising a reference voltage generating section configured to:
generate the determined variable reference voltage under control of the reference voltage control section; and
supply the determined variable reference voltage to the signal voltage sample-and-hold circuit.

7. An imaging device, comprising:
a signal voltage sample-and-hold circuit configured to sample and hold, as a sample signal voltage, a voltage obtained by division of a difference between a first voltage of a vertical signal line corresponding to a light reception amount in a pixel and a determined variable reference voltage;
a reference voltage control section configured to perform control to modulate a value of the determined variable reference voltage according to a dark current amount in the pixel;
a reset voltage sample-and-hold circuit configured to sample and hold, as a sample reset voltage, a voltage obtained by division of a difference between a second voltage of the vertical signal line when the pixel is initialized and a determined fixed reference voltage;
a differential conversion circuit configured to:
convert a difference between the sample signal voltage and the sample reset voltage to a current signal; and
supply the current signal as an analog signal;
an analog-to-digital converter configured to convert the analog signal to a digital signal; and
a digital signal processing circuit configured to process the digital signal.

8. A method for controlling a solid-state imaging element, the method comprising:
sampling and holding, as a sample signal voltage, a voltage obtained by dividing a difference between a first voltage of a vertical signal line corresponding to a light reception amount in a pixel and a determined variable reference voltage;
performing control to modulate a value of the determined variable reference voltage according to a dark current amount in the pixel;
sampling and holding, as a sample reset voltage, a voltage obtained by dividing a difference between a second voltage of the vertical signal line when the pixel is initialized and a determined fixed reference voltage;
converting a difference between the sample signal voltage and the sample reset voltage to a current signal;
supplying the current signal as an analog signal; and
converting the analog signal to a digital signal.

* * * * *